(12) United States Patent
Koyama et al.

(10) Patent No.: US 6,441,484 B2
(45) Date of Patent: Aug. 27, 2002

(54) SEMICONDUCTOR DEVICE HAVING SWITCHING ELEMENTS AROUND A CENTRAL CONTROL CIRCUIT

(75) Inventors: Kenji Koyama, Komoro; Norinaga Arai, Ueda; Akio Mikami, Maebashi; Mamoru Iizuka, Komoro, all of (JP)

(73) Assignees: Hitachi, Ltd., Tokyo; Hitachi Tohbu Semiconductor, Ltd., Gunma, both of (JP)

(*) Notice: Subject to any disclaimer, the term of this patent is extended or adjusted under 35 U.S.C. 154(b) by 0 days.

(21) Appl. No.: 09/859,408

(22) Filed: May 18, 2001

(30) Foreign Application Priority Data

May 23, 2000 (JP) .................................. 2000-151866

(51) Int. Cl.⁷ .............................................. H01L 23/34
(52) U.S. Cl. ....................... 257/724; 257/723; 257/666; 257/713; 257/675
(58) Field of Search ................................ 257/666, 668, 257/675, 724, 723, 713

(56) References Cited

U.S. PATENT DOCUMENTS 5,362,984 A * 11/1994 Konda et al. ............... 257/666
5,604,674 A * 2/1997 Terasawa .................... 363/147
5,642,952 A    7/1997 Tomatsu et al. ............ 400/624

FOREIGN PATENT DOCUMENTS

| JP | 5-234495 | 9/1993 |
| JP | 7-58293 | 3/1995 |

OTHER PUBLICATIONS 2.5 V–Driven Type 3rd Generation Trench Gate MOSFET, in Toshiba Review, vol. 53, No. 11 (1998), pp. 45–47. (Month Unknown).

* cited by examiner

Primary Examiner—David Nelms
Assistant Examiner—Tu-Tu Ho
(74) Attorney, Agent, or Firm—Mattingly, Stanger & Malur, P.C.

(57) ABSTRACT

A semiconductor device comprises: a first semiconductor chip having a control circuit; a plurality of second semiconductor chips whose operation is controlled by the control circuit; and a resin sealing body for sealing the first semiconductor chip and the plurality of second semiconductor chips, wherein: the first semiconductor chip is arranged in the central portion of the resin sealing body; and the plurality of second semiconductor chips are arranged on a periphery of the first semiconductor chip. A fuse element is further arranged outside the plurality of second semiconductor chips.

18 Claims, 20 Drawing Sheets

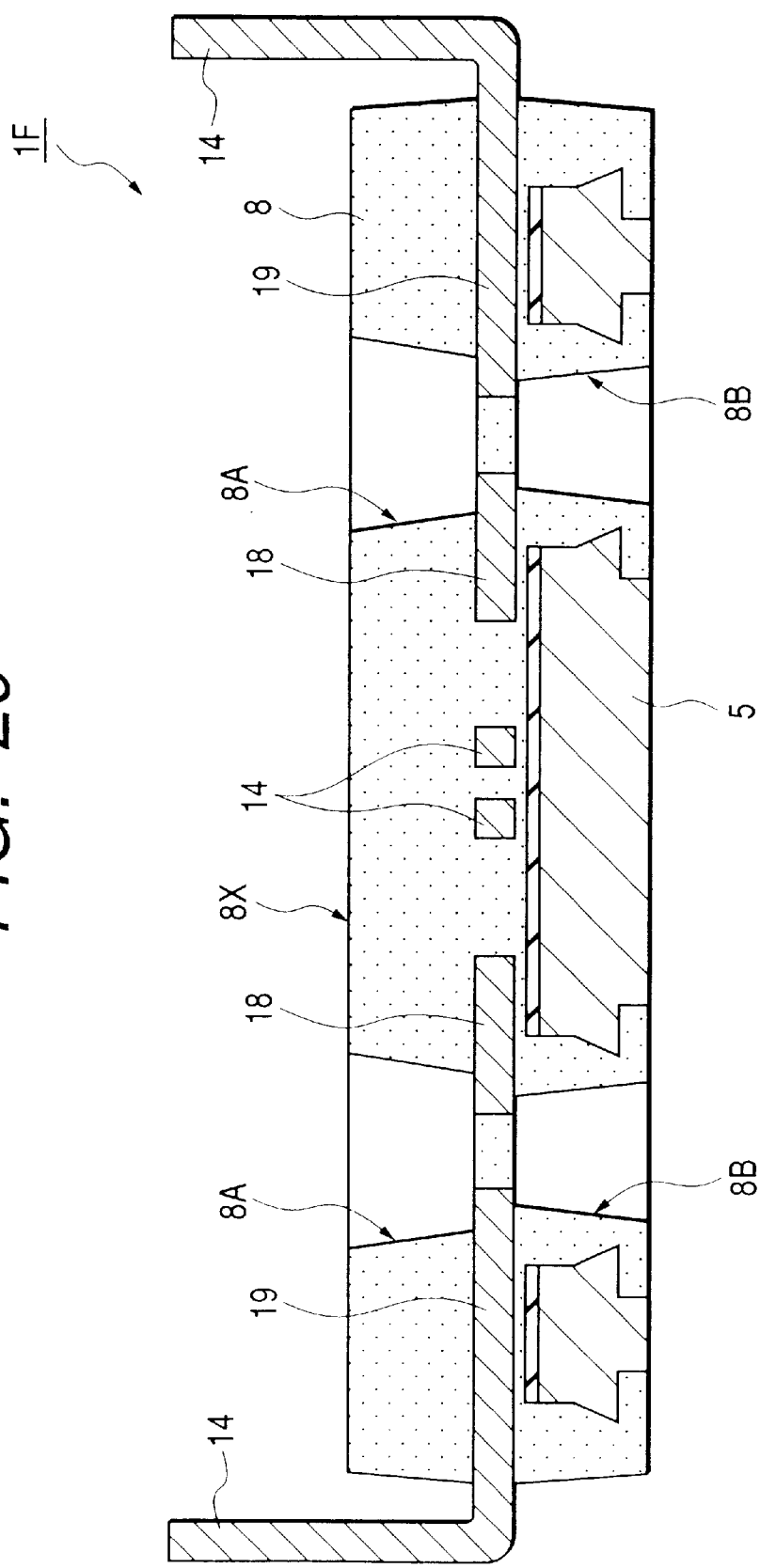

SEMICONDUCTOR DEVICE HAVING SWITCHING ELEMENTS AROUND A CENTRAL CONTROL CIRCUIT

BACKGROUND OF THE INVENTION

The present invention relates to a semiconductor device and more particularly to a technique effectively applicable to packaging of semiconductor devices.

Semiconductor devices of elemental structure for use as switches in power supply-related items including power amplifiers and power source units are available-in various package structures. For instance "2.5 V-Driven Type 3rd Generation Trench Gate MOSFET" in *Toshiba Review*, Vol. 53, No. 11 (1998), pp.45–47, describes a semiconductor device for power supply use of a package structure known as TSSOP (Thin Shrink small Out-line Package) type. In this TSSOP type semiconductor device, as a switching element, for instance, a semiconductor chip with a power MOSFET (Metal Oxide Semiconductor Field Effect Transistor) built into it is sealed with a resin sealing body.

On the other hand, the Japanese Published Unexamined Patent Application No. Hei 7-58293 (1995) (the counterpart of the U.S. Pat. No. 5,642,252) discloses a circuit system for controlling the turning on/off of a power MOSFET built into a semiconductor chip that is controlled with a controller.

Further, the Japanese Published Unexamined Patent Application No. Hei 5(1993)-234495 discloses a semiconductor device for power supply use in which a semiconductor chip with a built-in power MOSFET and a fuse element whose fusible portion is fused by its own heat when an overcurrent flows are sealed by a single resin sealing body. The fuse element is provided to prevent trouble from occurring when the source and drain of the power MOSFET are short-circuited to each other, and is connected to the power MOSFET in series.

SUMMARY OF THE INVENTION

Incidentally, the present inventors developed a semiconductor device (module) semiconductor chip with a built-in control circuit (hereinafter to be referred to simply as a "control chip"), a plurality of semiconductor chips (hereinafter to be referred to simply as "switching chips") each with a power MOSFET, as switching elements whose turning on/off is controlled by the control chip, and a plurality of fuse elements individually connected by these switching chips are sealed by a single resin sealing body. During their work to develop this semiconductor device, the present inventors discovered the following problems.

(1) As the amperage handled by the switching chips is high, the quantity of heat generated is high relative to that generated by the control chip. Therefore, where the plurality of switching chips are to be sealed with the control chip by the single resin sealing body, the chip arrangement should be such that heat generated by these chips can be efficiently discharged out of the resin sealing body.

(2) Where the control chip and the switching chips are to be electrically connected by bonding wires, the bonding wires should be kept as short as practicable. If the bonding wires are too long, the hanging portions of wire loops, after they have bonded the chips, are apt to invite short circuiting, and this would result in a low yield of the manufacturing process. Longer bonding wires would also invite a low yield of the manufacturing process in another way because, when resin sealing body is formed by a transfer mold process, a wire flow due to the fluidity of resin pressure-injected into the cavity of the molding die is apt to lead to short circuiting. However, depending on how the chips are arranged, some switching chips may far more distant from the control chip than other switching chips, and bonding wires for these distant switching chips become extremely long.

(3) For fuse elements whose fusible portions are fused by their own heat when an overcurrent flows, it is essential to secure stable fusing currents (breaking currents). However, where the fuse elements are sealed together with switching chips generating large quantities of heat by a single resin sealing body, the heat generated by the switching chips are transmitted via the resin of the resin sealing body to the fuse elements to destabilize the fusing currents of the fuse elements. Moreover, as the heat generated by the fuse elements escapes via the resin of the resin sealing body, the fusing currents of the fuse elements are destabilized in this respect as well. Then, selective providing hollows in the fuse element part to prevent the elements from getting in contact with the resin of the resin sealing body could restrain the effect of heat transmitted via the resin of the resin sealing body and that of heat escaping via the resin of the resin sealing body, and this contributes to stabilizing the fusing currents of the fuse elements, but it is difficult to selective form hollows in the fuse element part by the transfer mold method which is suitable for mass production.

Furthermore, for a semiconductor device requiring high heat radiation, a heat radiation plate (cooling wheel) is selected. In a package structure having a heat radiating plate, as heat generated by switching chips is more easily transmitted to fuse elements and heat generated by the fuse elements can more easily escape, the fusing currents of the fuse elements become even more unstable.

An object of the present invention, therefore, is to provide a technique capable of helping improve heat radiation from semiconductor devices.

Another object of the invention is to provide a technique capable of helping enhance the yield in semiconductor device manufacturing.

Still another object of the invention is to provide a technique capable of helping stabilize the stability of the fusing currents of fuse elements.

These and other objects and novel features of the invention will become apparent from the following description of the specification when taken in conjunction with the accompanying drawings.

Typical aspects of the invention disclosed in this application will be briefly outlined below.

(1) A semiconductor device comprising:
a first semiconductor chip having a control circuit,
a plurality of second semiconductor chips each having a switching element, and
a resin sealing body for sealing the first semiconductor chip and the plurality of second semiconductor chips, wherein:
the first semiconductor chip is arranged in the central portion of the resin sealing body, and
the plurality of second semiconductor chips are arranged on a periphery of the first semiconductor chip.

(2) A semiconductor device comprising:
a first semiconductor chip having on one main surface a control circuit and a plurality of electrodes,
a plurality of second semiconductor chips each having on one main surface a switching element and an electrode,
a plurality of bonding wires for electrically connecting the plurality of electrodes of the first semiconductor chip and respective electrodes of the plurality of second semiconductor chips, and a resin sealing body for sealing the first semiconductor chip, the plurality of second semiconductor chips and the plurality of bonding wires, wherein:

the first semiconductor chip is arranged in the central portion of the resin sealing body, and the plurality of second semiconductor chips are arranged on a periphery of the first semiconductor chip.

(3) The semiconductor device described in (1) or (2), wherein:

the plurality of second semiconductor chips are arranged symmetrically relative to the first semiconductor chip.

(4) A semiconductor device comprising:

a first semiconductor chip having a control circuit, a plurality of second semiconductor chips each having a switching element, a plurality of fuse elements whose fusible portions are fused by their own heat when an overcurrent flows, and a resin sealing body for sealing the first semiconductor chip, the plurality of second semiconductor chips and the plurality of fuse elements, wherein:

the first semiconductor chip is arranged in the central portion of the resin sealing body, the plurality of second semiconductor chips are arranged on a periphery of the first semiconductor chip, and the plurality of fuse elements are arranged on a periphery of the first semiconductor chip and outside the second semiconductor chips.

(5) A semiconductor device comprising:

a first semiconductor chip having on one main surface a control circuit and a plurality of electrodes, a plurality of second semiconductor chips each having on one main surface a fuse element and an electrode, a plurality of fuse elements whose fusible portions are fused by their own heat when an overcurrent flows, a plurality of bonding wires for electrically connecting the plurality of electrodes of the first semiconductor chip and respective electrodes of the plurality of second semiconductor chips, and a resin sealing body for sealing the first semiconductor chip, the plurality of second semiconductor chips and the plurality of bonding wires, wherein:

the first semiconductor chip is arranged in the central portion of the resin sealing body, the plurality of second semiconductor chips are arranged on a periphery of the first semiconductor chip, and the plurality of fuse elements are arranged on a periphery of the first semiconductor chip and outside the second semiconductor chips.

(6) The semiconductor device described in (4), wherein:

the plurality of second semiconductor chips are arranged symmetrically relative to the first semiconductor chip.

(7) A semiconductor device comprising:

a semiconductor chip having a switching element, a fuse element whose fusible portion is fused by its own heat when an overcurrent flows, one end of the fuse element being connected to a first pad and the other end being connected to a second pad, and a resin sealing body for sealing the semiconductor chip, the fuse element and the first and second pads, wherein:

the resin sealing body has, in a portion opposite to the fuse element, concave portions sinking from one main surface of the resin sealing body toward the fuse element.

(8) The semiconductor device described in (7), wherein:

the concave portions is formed in such a depth that from its bottom surface an intermediate portion of the fuse element is exposed.

(9) The semiconductor device described in (7), wherein:

the concave portions is formed in such a depth that between its bottom surface and the fuse element the resin of the resin sealing body intervenes.

(10) A semiconductor device comprising:

a semiconductor chip having a switching element, a fuse element whose fusible portion is fused by its own heat when an overcurrent flows, one end of the fuse element being connected to a first pad and the other end being connected to a second pad, and a resin sealing body for sealing the semiconductor chip, the fuse element and the first and second pads, wherein:

an intermediate port of the fuse element is covered with a resin whose thermal conductivity is lower than that of the resin of the resin sealing body.

(11) A semiconductor device comprising:

a heat radiation plate having one main surface and another main surface opposite to each other and through holes continuous from the former main surface to the latter main surface, a semiconductor chip having on one main surface a switching element and arranged on one main surface of the heat radiating plate, a first pad and a second pad arranged on one main surface of the heat radiating plate, a fuse element whose fusible portion is fused by its own heat when an overcurrent flows, one end of the fuse element being connected to the first pad and the other end being connected to the second pad, and a resin sealing body for sealing the semiconductor chip, the first and second pads and the fuse element, resin sealing body being fixed to the heat radiating plate, wherein:

the through holes penetrating the heat radiation plate are arranged in a position opposite to the fuse element.

(12) The semiconductor device described in (11), wherein:

the resin sealing body has, in a portion opposite to the fuse element, a first concave portion sinking from one main surface of the resin sealing body opposite to one main surface of the semiconductor chip toward the fuse element and a second concave portion sinking from the other main surface opposite to one main surface of the resin sealing body through the through holes in the heat radiation plate toward the fuse element.

(13) The semiconductor device described in (12), wherein:

the first and second concave portions are formed in such a depth that from their bottom surfaces an intermediate portion of the fuse element is exposed.

(14) The semiconductor device described in (7), wherein:

the first and second concave portions are formed in such a depth that between their bottom surfaces and the fuse element the resin of the resin sealing body intervenes.

BRIEF DESCRIPTION OF THE DRAWINGS

FIG. 20 is a schematic section of the semiconductor device, which is Embodiment 6 of the invention.

DESCRIPTION OF THE PREFERRED EMBODIMENTS

Figure 1:
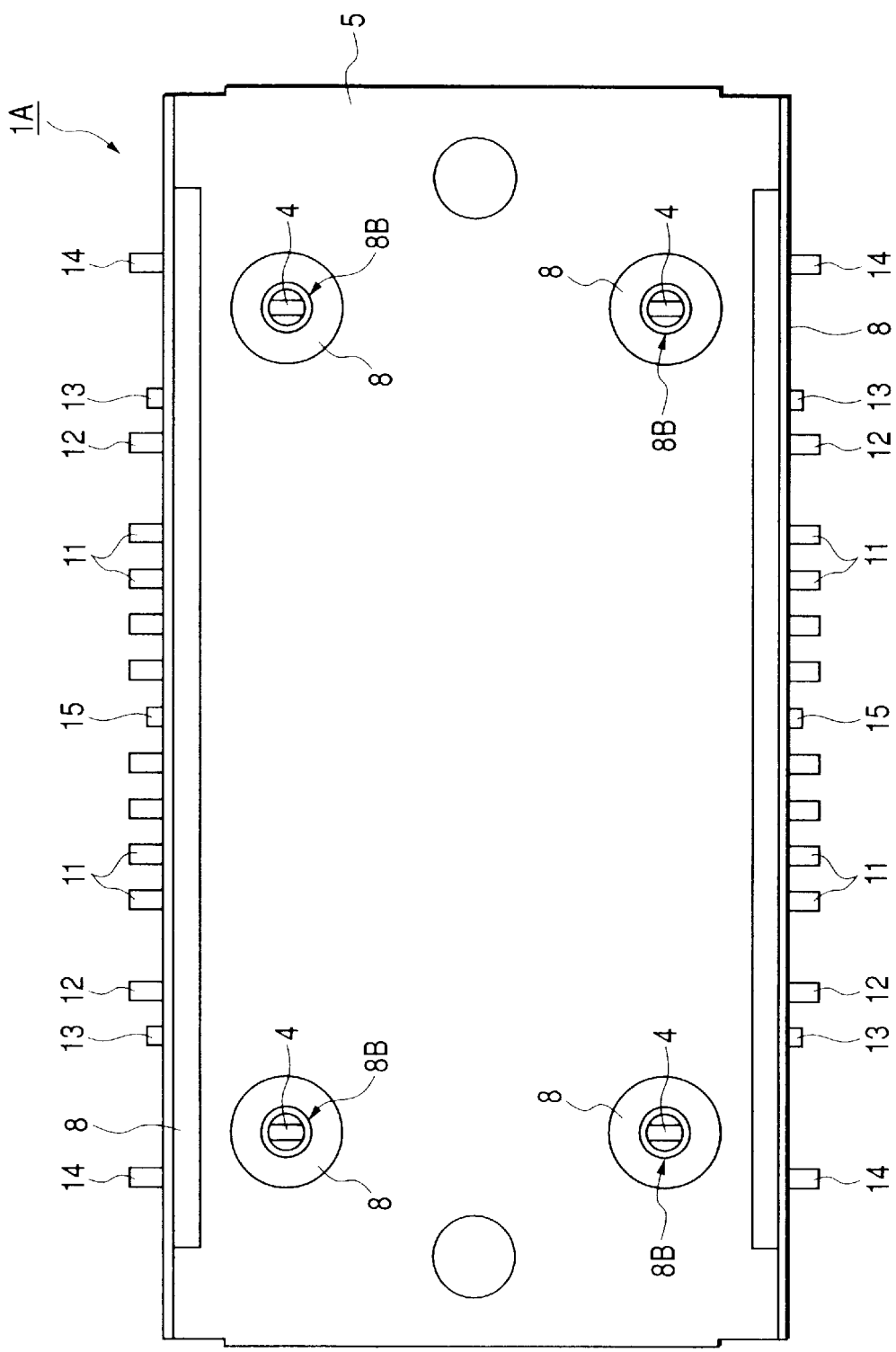
FIG. 1 is a schematic plan of a semiconductor device, which is Embodiment 1 of the present invention.

Preferred embodiments of the present invention will be described in detail below with reference to the accompanying drawings. In all the drawings for describing the embodiments of the invention, the same reference numerals will be assigned to elements having respectively the same functions, and duplication of the same functions will be avoided.
(Embodiment 1)

Regarding this embodiment, an example in which the invention is applied to a semiconductor device of package structure having a heat radiation plate will be described.

Figure 2:
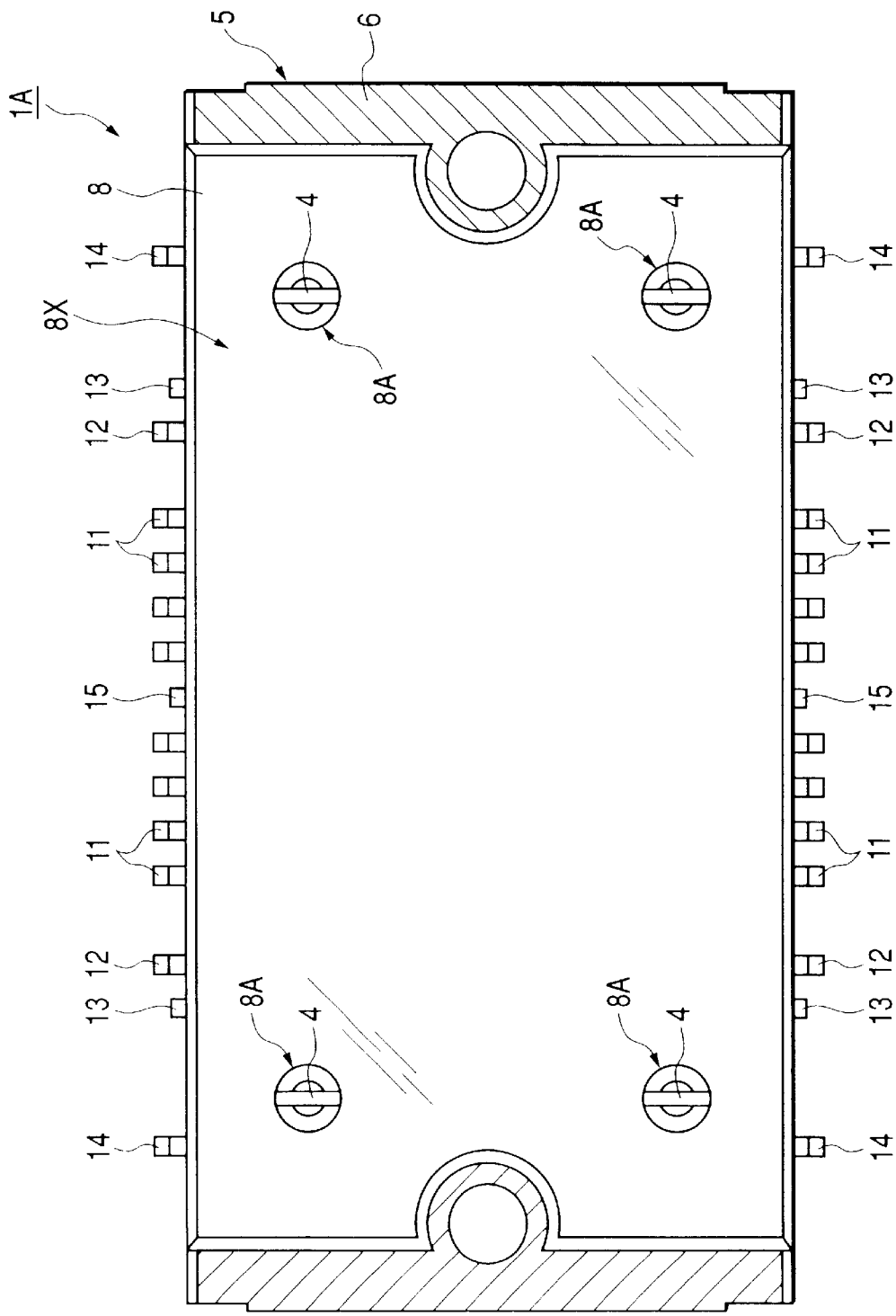
FIG. 2 is a schematic bottom plan of the semiconductor device, which is Embodiment 1 of the present invention.
Figure 3:
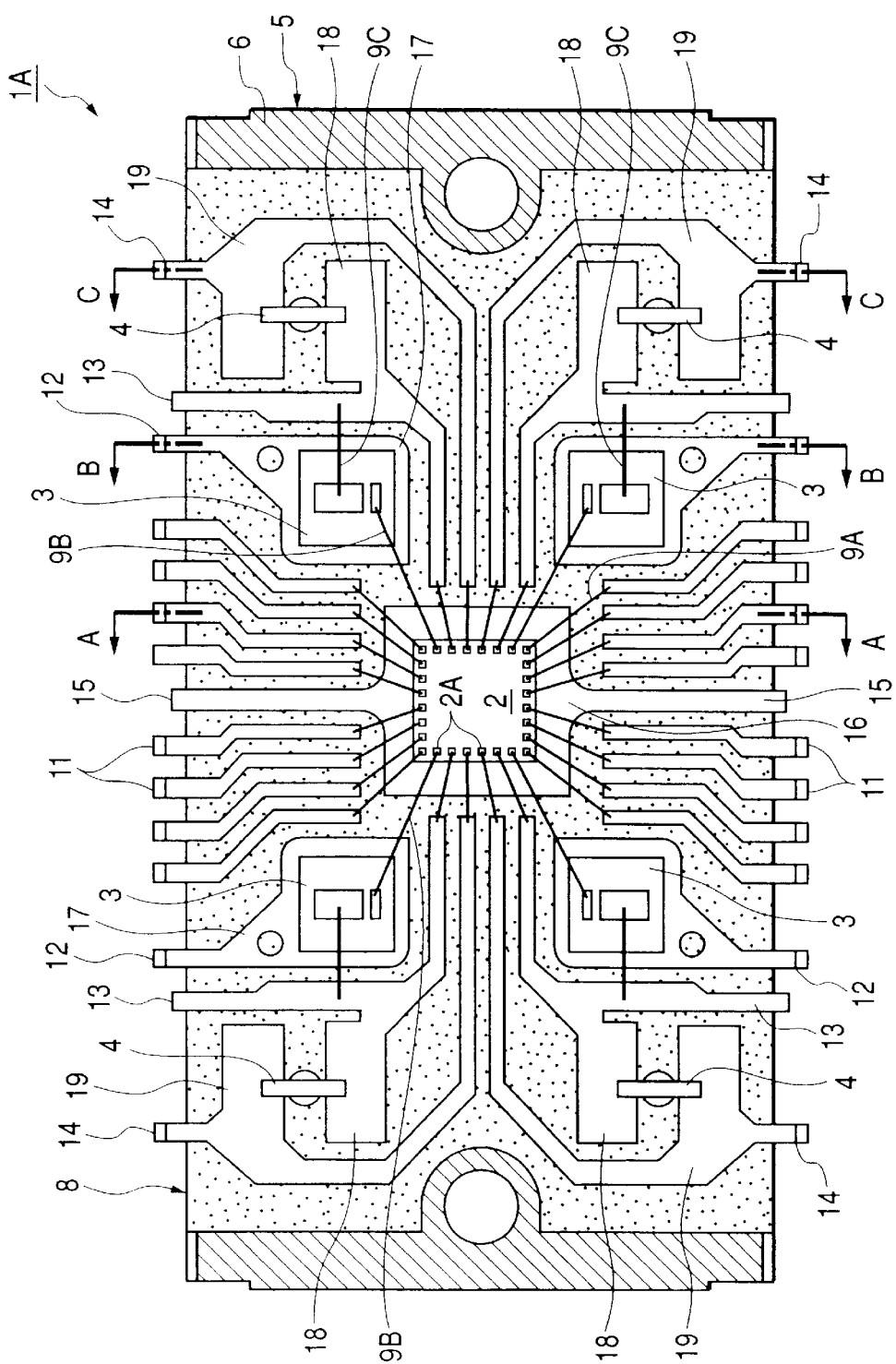
FIG. 3 is a schematic bottom plan of a state in which part of the resin sealing body in FIG. 2 is removed.
Figure 4:
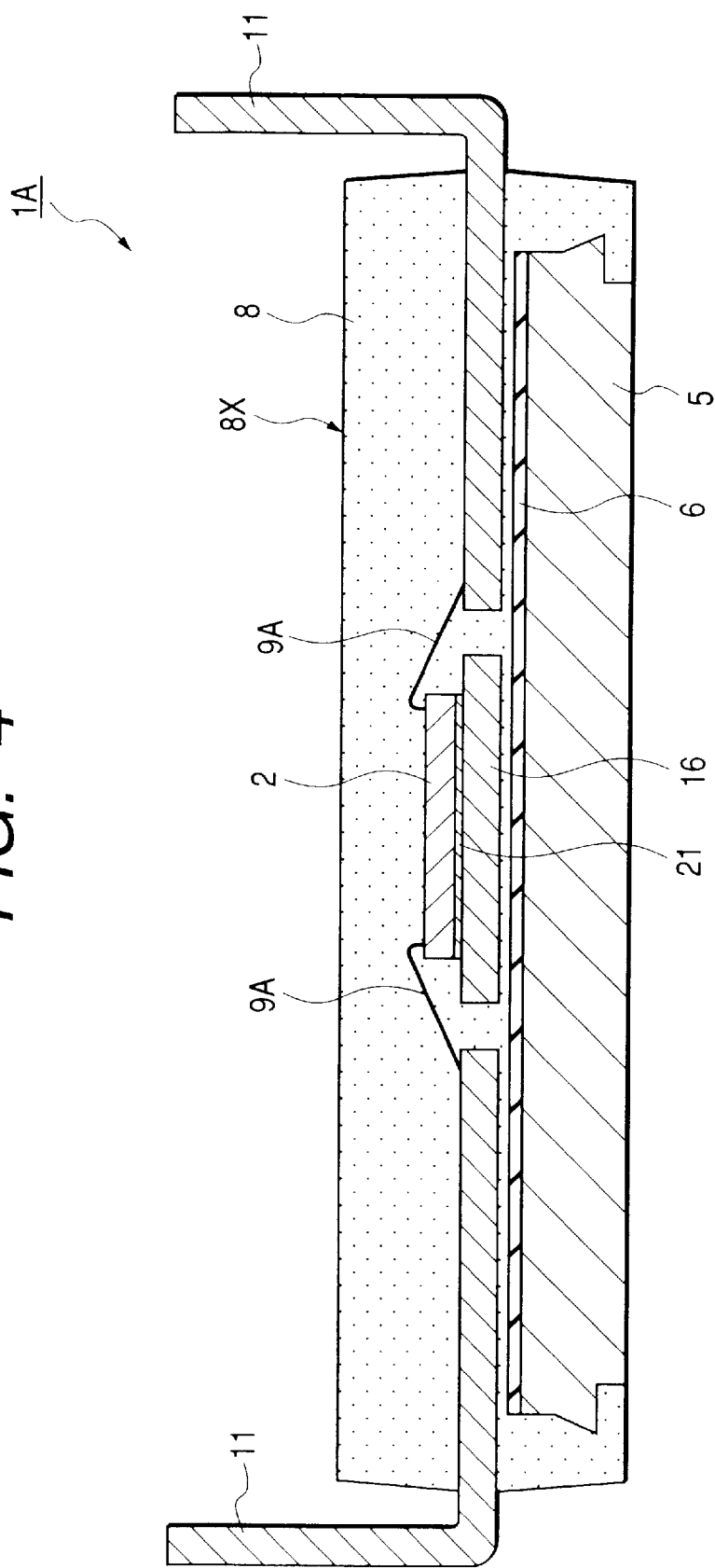
FIG. 4 is a schematic section along line A—A in FIG. 3.
Figure 5:
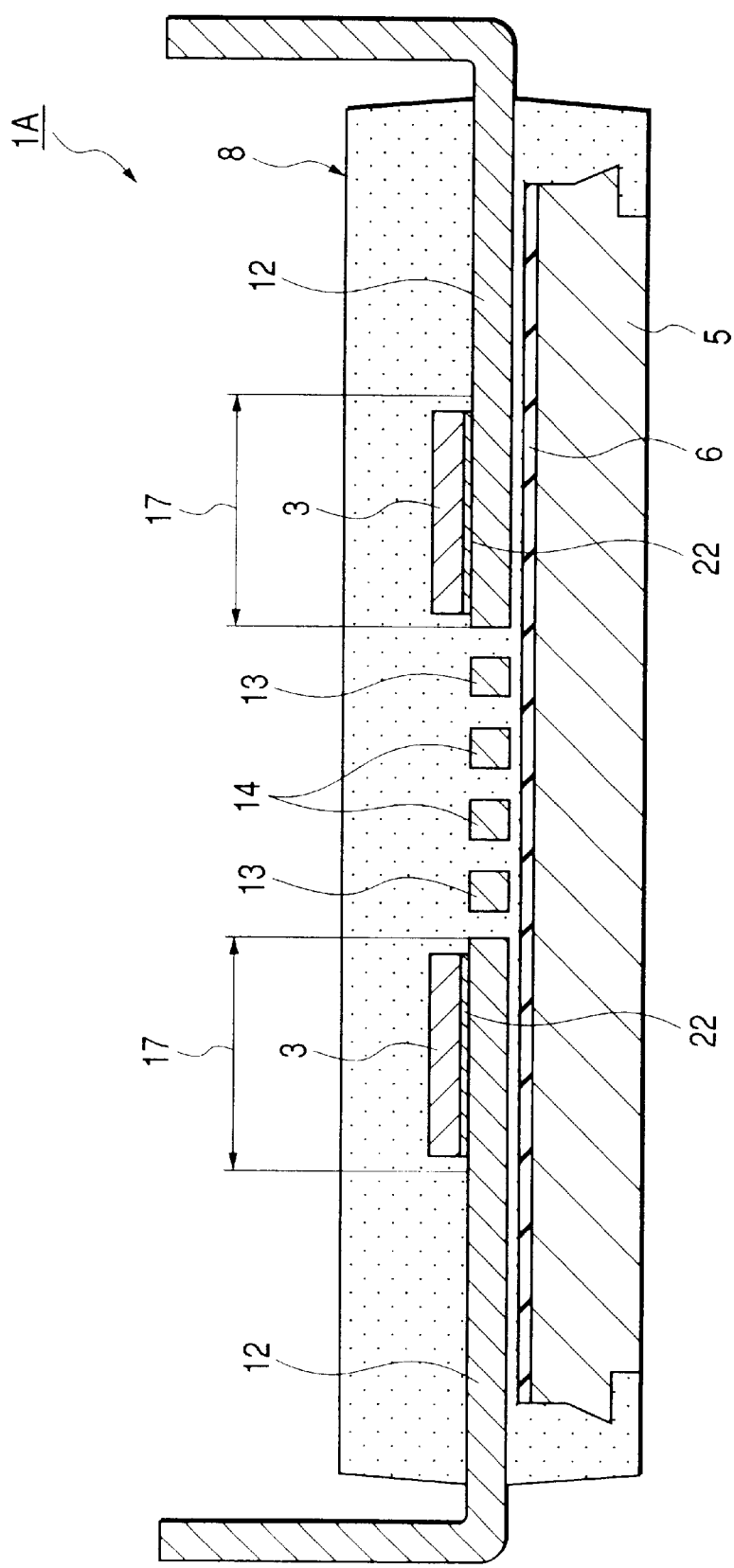
FIG. 5 is a schematic section along line B—B in FIG. 3.
Figure 6:
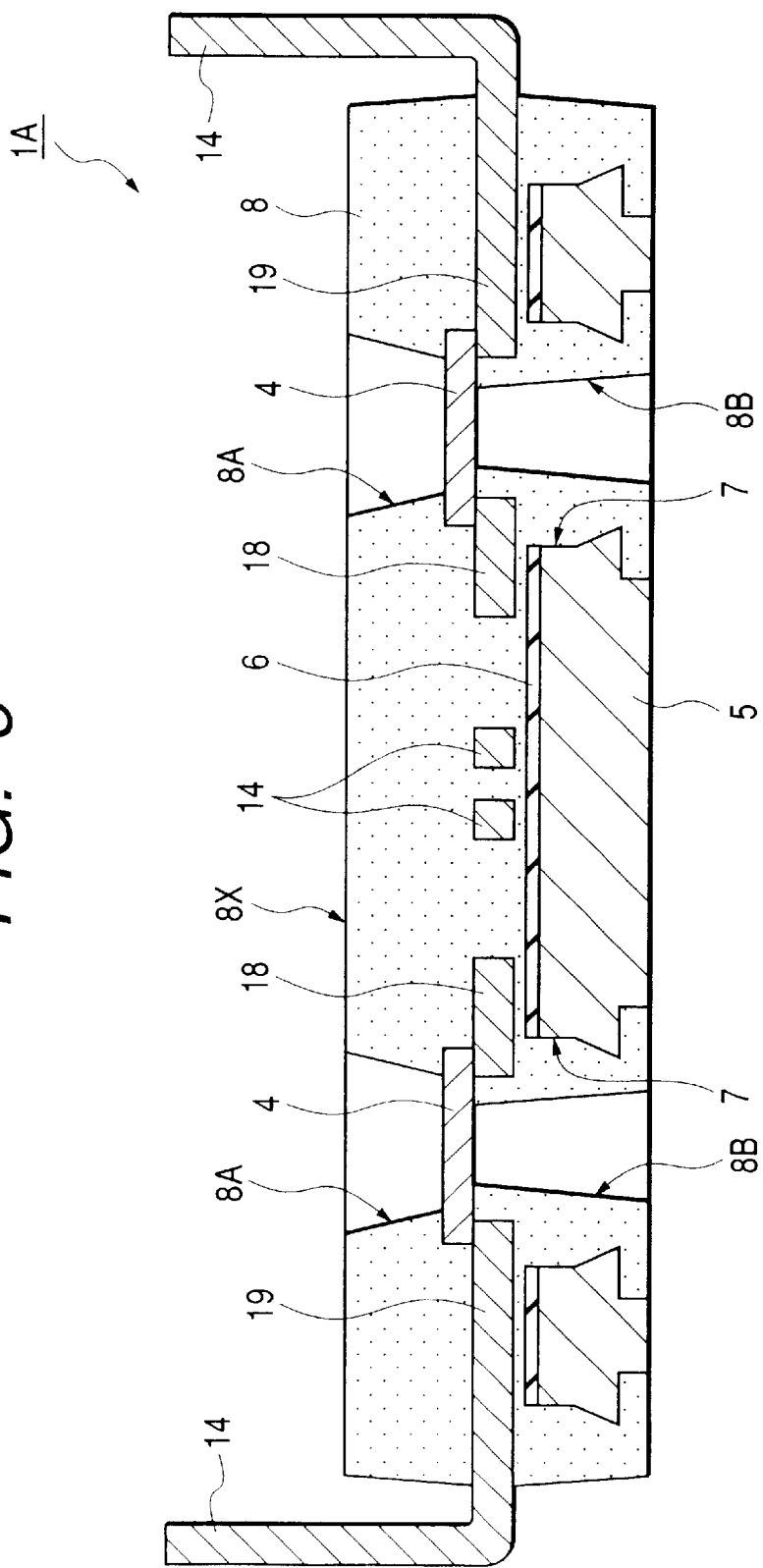
FIG. 6 is a schematic section along line C—C in FIG. 3.
Figure 7:
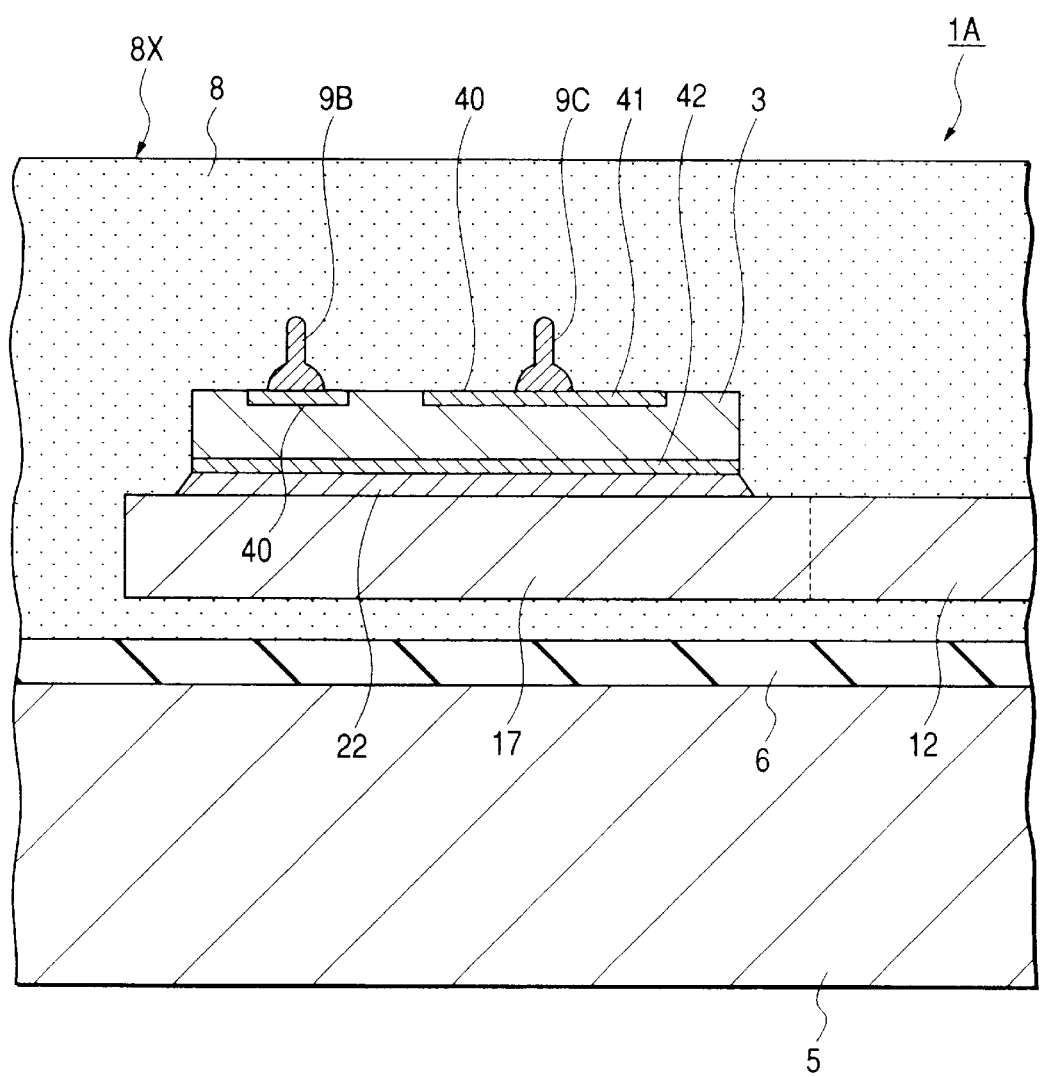
FIG. 7 is a schematic section in which part of FIG. 5 is expanded.
Figure 8:
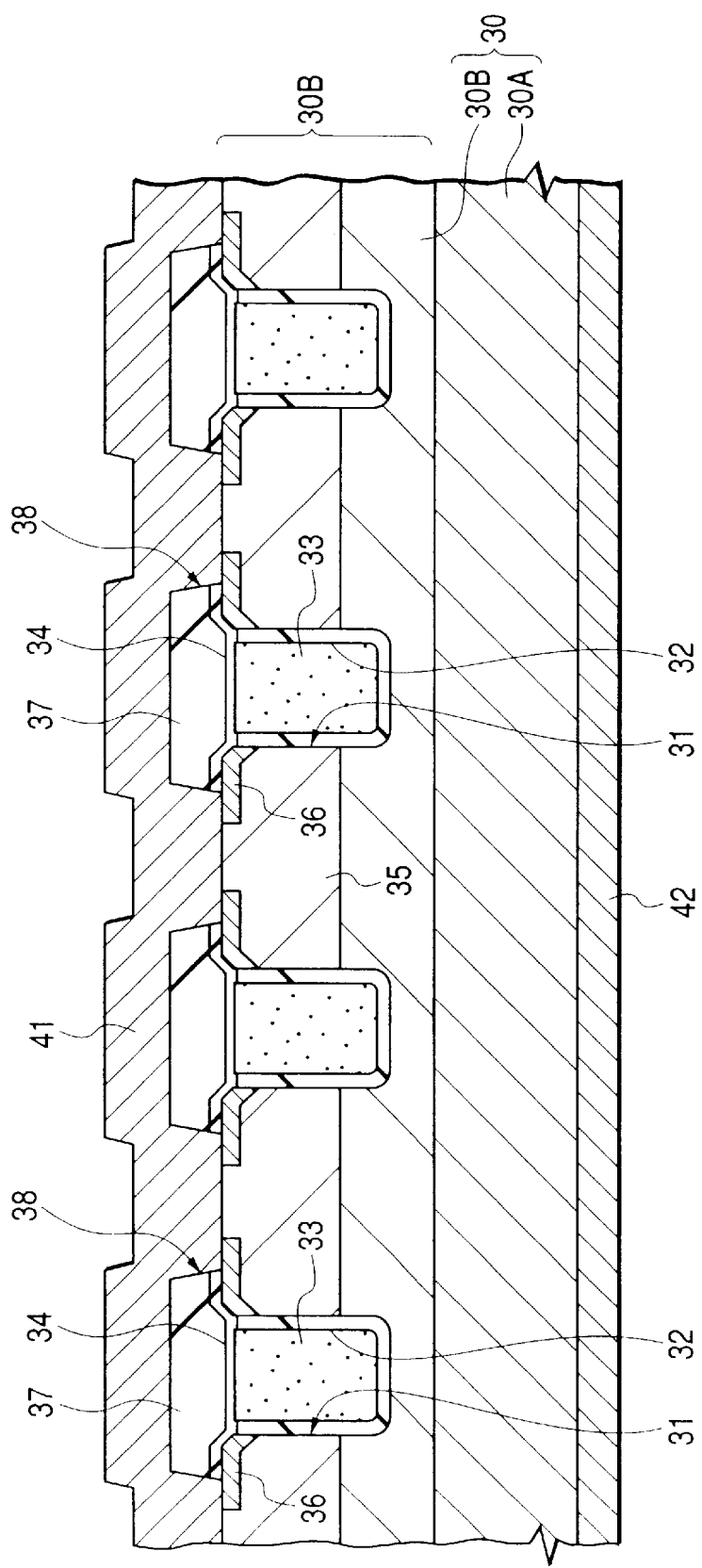
FIG. 8 is a schematic section illustrating a rough iconfiguration of the switching chip in FIG. 1.
Figure 9:
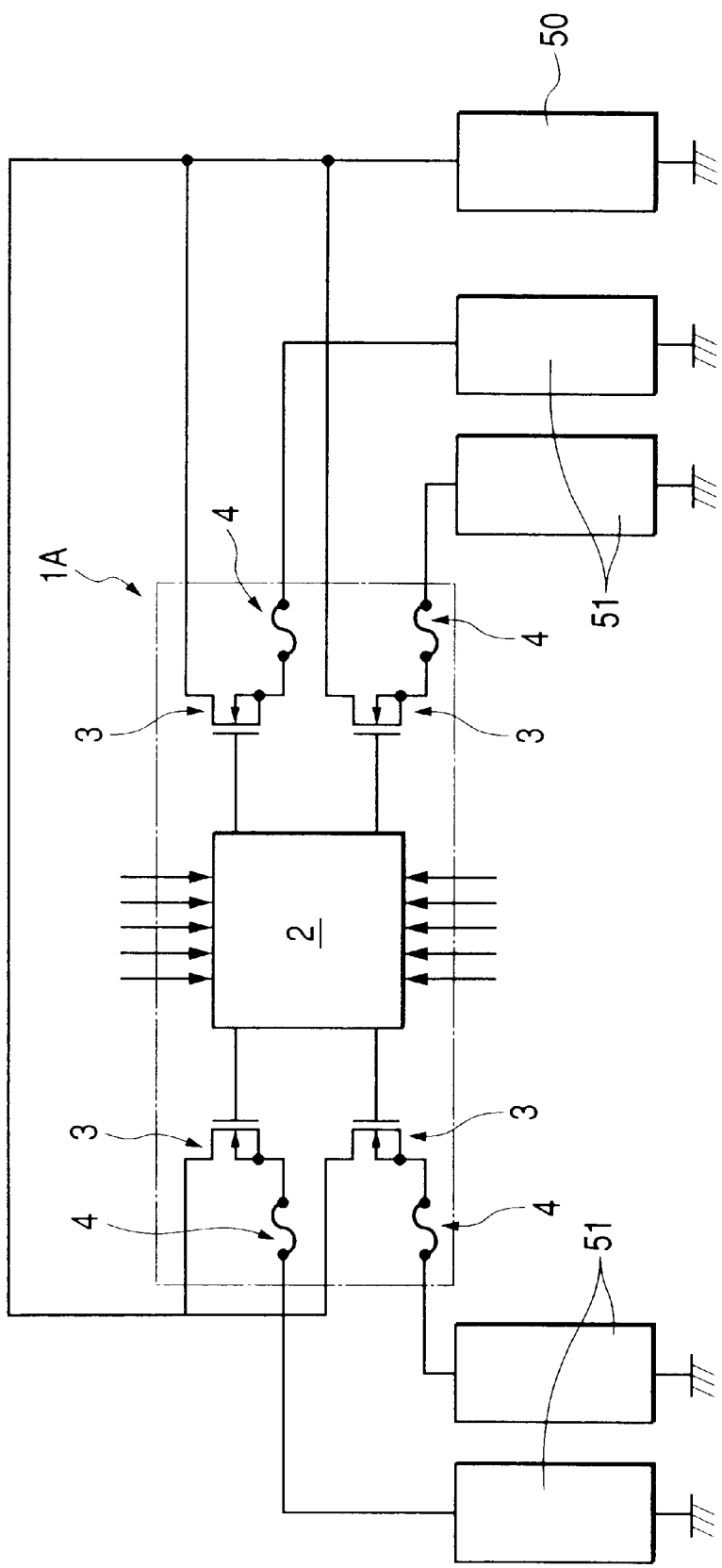
FIG. 9 is a block diagram of an automobile circuit system into which the semiconductor device, which is Embodiment 1 of the invention is incorporated.

FIG. 1 is a schematic plan of a semiconductor device, which is Embodiment 1 of the present invention;

FIG. 2 is a schematic bottom plan of the semiconductor device of FIG. 1;

FIG. 3 is a schematic bottom plan of a state in which part of the resin sealing body in FIG. 2 is removed;

FIG. 4 is a schematic section along line A—A in FIG. 3;

FIG. 5 is a schematic section along line B—B in FIG. 3;

FIG. 6 is a schematic section along line C—C in FIG. 3;

FIG. 7 is a schematic section in which part of FIG. 5 is expanded;

FIG. 8 is a schematic section illustrating a rough configuration of the switching chip in FIG. 1; and FIG. 9 is a block diagram of an automobile circuit system into which the semiconductor device of FIG. 1 is incorporated.

As shown in FIG. 1 through FIG. 7, a semiconductor device 1A in this embodiment has a configuration mainly comprising one control chip 2 with a built-in control circuit, four switching chips 3 with built-in switching elements, four fuse elements 4 whose fusible portions are fused by their own heat when an overcurrent flows, a heat radiation plate 5 on one of whose main surfaces is formed an insulating layer 6, a resin sealing body 8, a plurality of bonding wires (9A, 9B, 9C), a plurality of lead (11, 12, 13, 14, 15), one die pad 16, four die pads 17 and four pads (18, 19). In this embodiment, the plurality of leads may include, four instance four leads 11, four leads 12, four leads 13, four leads 14 and two leads 15. As the switching elements are used power MOSFETs, which are insulating gate type field effect transistors. These power MOSFETs have a configuration in which a plurality of transistor cells are connected in parallel.

As shown in FIG. 3 and FIG. 4, the planar shape of the control chip 2 is quadrilaterally formed. The control chip 2 has a configuration in which, of mutually opposite main surfaces (one is the element forming surface and the other, the back surface), one has the control circuit and the plurality of electrode (bonding pads) 2A. The control chip 2 has a configuration mainly comprising a semiconductor substrate made of monocrystalline silicon and a multilayer interconnection layer formed over this semiconductor substrate. The control circuit comprises a transistor element formed over one main surface (element forming surface) of the semiconductor substrate and wiring formed over the multilayer interconnection layer among other elements. Each of the plurality of electrodes 2A is formed in the uppermost interconnection layer of the multilayer interconnection layer of the control chip 2. The uppermost interconnection layer is covered with a surface protective layer (final protective layer), and in this surface protective layer is formed a bonding opening to expose the electrodes 2A.

The back surface of the control chip 2 is connected via adhesive 21 to one main surface of the die pad 16 in a state of opposing either of one main surface (chip mounting surface) and the other main surface (back surface) which oppose each other. The adhesive 21 may be, for instance, lead (Pb)-tin (Sn) solder, which excels in thermal conductivity.

As shown in FIG. 3 and FIG. 7, the planar shape of the four switching chips 3 is quadrilaterally formed. In this embodiment, the four switching chips 3 have the same structure and the same function, though this similarity is not restricted.

Each of the switching chips 3 has a configuration in which a power MOSFET (switching element), a gate electrode 40 and a source electrode 41 are arranged on either of one main surface (element forming surface) and the other main surface (back surface), and a drain electrode 42 on the other main surface.

The drain electrode 42 formed on the back surface of each switching chip 3 is adhered and fixed via adhesive 22 to one main surface of the matching die pad 17 in a state of opposing either of one main surface (chip mounting surface) and the other main surface (back surface) of the die pad 17 which oppose each other. The adhesive 22 may be, for instance, Pb—Sn solder, which excels in thermal conductivity.

The switching chips 3 are connected in series to the mutually different fuse elements 4. The power MOSFET of each switching chip 3 is subject to ON/OFF operations by the control circuit of the control chip 2. In this embodiment, power consumption by the control chip 2 is about 0.5 [W], for instance, and that of a switching chip 3, about 3.0 [W]. Thus a switching chip 3 generates more heat than the control chip 2 does.

Each switching chip 3, as shown in FIG. 8, is configured mainly of a semiconductor substrate 30, in which, for instance, an n-type semiconductor layer 30B made of monocrystalline silicon is formed over one main surface of an n+ type semiconductor substrate 30A made of monocrystalline silicon.

In the element forming region (active region) of one main surface of the semiconductor substrate 30 is formed a power MOSFET (switching element) comprising a plurality of transistor cells connected in parallel. This power MOSFET has an n-channel type vertical structure.

The power MOSFET has a configuration mainly comprising a channel forming region, a gate insulating film 32, gate conductor layer 33, a source region and a drain region. The channel forming region is configured of a p type well region 35 formed in the n– type semiconductor layer 30B. The source region is configured of an n+ type semiconductor region 36 formed in the p type well region 35. The drain region is configured of the n– type semiconductor layer 30B and the n+ type type semiconductor substrate 30A. The gate insulating film 32 is formed of, for instance, silicon oxide, so as to cover the inner surface of a grooves 31 sinking from one main surface of the n– type semiconductor layer 30B in the depthwise (thickness-wise) direction. The gate conductor layer 33 is embedded within the grooves 31 with the gate insulating film 32 in-between, and is formed of, for instance, a polycrystalline silicon film doped to reduce its resistance. Thus the power MOSFET has a trench gate type configuration.

The element forming region of the main surface of the n– type semiconductor layer 30B, which is one main surface of the semiconductor substrate 30, divided into a plurality of islands by the grooves 31. This plurality of islands are regularly arranged in a matrix, and their planar shape is formed in a flat octagon. Thus, the gate conductor layer 33 is formed of a mesh pattern enclosing the plurality of islands partitioned by the grooves 31. Incidentally, the n+ type semiconductor region 36, which is the source region, formed on one main surface of the islands partitioned by the grooves 31.

The n+ type semiconductor region 36 and the p type well region 35 are connected openings 38, formed in an inter-layer insulating film 37, to the source electrode 41 formed over them. The inter-layer insulating film 37, provided between the gate conductor layer 33 and the source electrode 41, insulates and separates the gate conductor layer 33 and the source electrode 41 from each other. The source electrode 41 is formed of, for instance, a metallic film such as aluminum (Al) film or aluminum alloy film. Between the gate conductor layer 33 and the inter-layer insulating film 37, there is formed an insulating film 34.

The gate conductor layer 33 is formed integrated with gate extraction wiring (not shown) provided over a peripheral region (inactive region) around one main surface of the n– type semiconductor layer 30B via an insulating film. The gate extraction wiring is electrically connected through a port provided in the inter-layer insulating film 37 to a gate electrode 40 provided in the layer above the film. The gate electrode 40 is formed on the same layer as the source electrode 41, and the source electrode 41 and the gate electrode 40 are insulated and separated from each other. Over the source electrode 41 is formed a surface protective layer, and in this surface protective layer are provided a bonding port for exposing the source electrode 41 and another bonding port for exposing the gate electrode 40.

The drain electrode 42 is formed all over one main surface of the n+ type semiconductor substrate 30A opposite to the other main surface, and electrically connected to the n+ type semiconductor substrate 30A. The drain electrode 42 is formed of, for instance, an Au film.

As shown in FIG. 3 and FIG. 6, one end of each of the four fuse elements 4 is electrically and mechanically connected to the mutually differing pads 18 and the other end is electrically and mechanically connected to the mutually differing pads 19.

Each of these four fuse elements 4 is formed of a fusible body made of, for instance, zinc (Zn). In this embodiment, the four fuse element 4 have the same structure and the same function, though this similarity is not restricted.

As shown in FIG. 1 through FIG. 3, the planar shape of the heat radiation plate 5 is quadrilaterally formed, and in this embodiment is, for instance, a 50 [mm]×24 [mm] rectangle.

The heat radiation plate 5 has a thickness of, for instance, about 2 [mm], and formed of a metallic material of copper (Cu) or aluminum (Al) or an Cu or Al alloy, which excels in thermal conductivity.

As shown in FIG. 2 and FIG. 4, the planar shape of the resin sealing body 8 is quadrilaterally formed, and in this embodiment is, for instance, a 42 [mm]×24 [mm] rectangle. The resin sealing body 8, with a view to reducing stress, is formed of an epoxy-based thermosetting resin to which, for instance, a phenol-based curing agent, silicone rubber, filler and the like are added. The resin sealing body 8 is formed by a transfer mold process, which is suitable for mass production. The transfer mold process is a method of forming a resin sealing body by which, using a mold die provided with a pot, runner, inlet gate, cavity and the like, thermosetting resin is poured into the cavity from the pot through the runner and the inlet gate.

As shown in FIG. 3 through FIG. 6, each of sixteen leads 11 and four leads (12, 14) is configured to have an inner portion located within the resin sealing body 8 and an outer portion located outside the resin sealing body 8. The outer portion of each of these leads (11, 12, 14) is bent and molded so that its tip be located on one main surface 8X of two mutually opposite main surfaces of the resin sealing body 8 (one opposing one main surface of a switching chip). Thus, the outer portion of each of the leads (11, 12, 14) is configured as an external terminal for electrical connection to the outside. Incidentally, in this embodiment, the main surface 8X of the resin sealing body 8, when packaged into the semiconductor device 1A, is opposite to the mounting surface of the mounting substrate.

Each of the four leads 13 and two leads 15 is configured to have an inner portion located within the resin sealing body 8 and an outer portion located outside the resin sealing body 8. The outer portion of each of these leads (13, 15), unlike the outer portion of the lead 11, is formed in such a length that it slightly protrudes from the resin sealing body 8. Thus the outer portions of the leads (13, 15) are so configured as not to be electrically connected to the outside.

The tips of the inner portions of the sixteen leads 11, four leads 13 and four leads 14 are arranged around the die pad 16 so as to encircle the die pad 16. These tips of the inner portions of the leads (11, 13, 14) are electrically connected by the bonding wire 9A to the respectively matching electrodes 2A of the control chip 2.

The gate electrodes 40 of the four switching chips 3 are electrically connected by the bonding wire 9B to the respectively matching electrodes 2A of the control chip 2. The source electrodes 41 of the four switching chips 3 are electrically connected by the bonding wire 9C to the intermediate portions of the inner portions of the respectively matching leads 13. The four pads 18 are arranged near the respectively matching pads 17. In this embodiment, the bonding wires 9A and 9B are made of, for instance, gold (Au), ant the bonding wire 9C, of Al for instance. The bonding wires (9A, 9B, 9C) are connected by, for instance, a ball bonding method, which combines thermocompression bonding with ultrasonic vibration.

To add, while a single bonding wire 9C is used for electrical connection of the source electrodes 41 of the switching chips 3 with the leads 13 in this embodiment, a plurality of bonding wires 9C may as well be used for the electrical connection of these elements.

The four die pads 17 are leads 12. The four pads 18 are formed integrated with the inner portions of the respectively matching leads 13. The four pads 19 are formed integrated with the inner portions of the respectively matching leads 14.

The control chip 2, four switching chips 3, four fuse elements 4, the plurality of bonding wires (9A, 9B, 9C), inner portions of each of the plurality of leads (11, 12, 13, 14, 15), the die pad 16, four die pads 17 and four pads (18, 19) and so forth are arranged on one main surface of the heat radiation plate 6, and sealed by the single resin sealing body 8. The resin sealing body 8 is formed so as to cover one main surface of the heat radiation plate 5 and fixed to the heat radiation plate 6.

The inner portions of the plurality of leads (11, 12, 13, 14, 15), the plurality of die pads (16, 17) and the plurality of pads (18, 19) are arranged in isolation from the insulating layer 6 formed over one main surface of the heat radiation plate 5. The resin of the resin sealing body 8 is interposed between these inner portions of the leads, die pads and pads on the one hand and the insulating layer 6 on the other. The insulating layer 6, as will be described in detail later, is provided to keep from coming in contact with the heat radiation plate 5, because the positions of the inner portions of the leads, die pads and pads, are varied vertically by the fluidity of the resin injected under pressure into the cavity of the mold die when the resin sealing body 8 is formed by the transfer mold process. The insulating layer 6, in order to secure a sufficient dielectric strength (AC2 [KV]), is formed to a thickness of, for instance 0.08 to 0.1 [mm]. The insulating layer 6 is formed, of an insulating film made of, for instance, an epoxy thermosetting resin.

The plurality of leads are divided into two groups of leads. The outer portions of one group of leads are arranged along one of the two opposing long sides of the resin sealing body 8, and those of the other group of leads are arranged along the other long side of the resin sealing body 8. Thus the semiconductor device 1A, embodying the invention as described here, has a DIP (Dual In-line Package) type configuration.

As shown in FIG. 3, the control chip 2 is arranged in the central portion (an inside portion away from the periphery) of the resin sealing body 8. The four switching chips 3 are arranged around the control chip 2 (between the periphery of the resin sealing body 8 and the control chip 2) so as to encircle the control chip 2. The switching chip 3 generates a greater quantity of heat than the control chip 2. In a resin sealing body having a quadrilateral plane, thermal resistance is less on the periphery than in the central portion. Therefore, by arranging the control chip 2, which generates less heat than the switching chip 3, in the central portion of the resin sealing body 8 and the four switching chips 3, which generates more heat than the control chip 2 on its periphery, heat generated by the switching chips 3 can be discharged out of the resin sealing body 8 more efficiently, resulting in enhanced heat radiation performance of the semiconductor device 1A.

Further, since the arrangement of the four switching chips 3 around the control chip 2 makes possible disposition of the four switching chips 3 at substantially equal distances from the control chip 2, the length of the bonding wire 9B to electrically connect one electrode 2A of the control chip 2 to the gate electrode 40 of one switching chip 3 is kept from becoming excessively longer than those of the other bonding wires 9B electrically connecting the electrodes 2A of the control chip 2 to the gate electrodes 40 of the other switching chips 3.

The four switching chips 3 are arranged symmetrically with respect to the control chip 2. In this embodiment, the four switching chips 3 are separately arranged outside the four corners of the control chip 2. This configuration secures ample spacing between the switching chips 3, making it possible to restrain thermal interference between adjacent switching chips 3.

The four fuse elements 4 are arranged around the control chip 2 so as to encircle the control chip 2 outside the switching chips 3. This configuration serves to reduce the lengths of the bonding wires 9B electrically connecting the electrodes 2A of the control chip 2 to the gate electrodes 40 of the switching chips 3 compared with the lengths that would be required in the arrangement of the fuse elements 4 between the control chip 2 and the switching chips 3, thereby facilitating faster ON/OFF operation control of the power MOSFET.

Also, compared with the hypothetical case in which the fuse elements 4 are arranged between the control chip 2 and the switching chips 3, the thermal impact on the fuse elements 4 of heat generated by the chips can be restrained, with the result that the fusing currents of the fuse elements 4 can be stabilized.

The four fuse elements 4 are arranged symmetrically with respect to the control chip 2. In this embodiment, the four fuse elements 4 are separately arranged outside the four corners of the control chip 2 farther out than the switching chips 3. This configuration secures ample spacing between the fusing elements 4, making it possible to restrain thermal interference between adjacent fuse elements 4.

As shown in FIG. 3, the one die pad 16 and the four die pads 17 are dispersed from one another. Thus, the control chip 2 is adhered and fixed to the die pad 16 isolated from the four die pads 17, and the four switching chips 3 are separately adhered and fixed to the four die pads 17 isolated from one another. Since the die pad 16 to which the control chip 2 is adhered and fixed is separated from the die pads 17 to which the switching chips 3 are adhered and fixed, the switching chips 3 are hard to be transferred to the control chip 2, and thereby facilitates restraining of the impact of heat from the switching chips 3 on the control chip 2.

Furthermore, the separation of the four die pads 17 to which the four switching chips 3 are individually adhered and fixed from one another makes it difficult for heat from any one switching chip 3 to be transferred to the other switching chips 3, and thereby facilitates restraining of the impact of heat from any one switching chip 3 on the other switching chips 3.

As shown in FIG. 6, the heat radiation plate 5 has a configuration in which the through holes 7 penetrating from one main surface to the other are provided. Since four fuse elements 4 are provided in this embodiment, the number of the through holes 7 is also four. Further in this embodiment, as the insulating layer 6 is provided over one main surface of the heat radiation plate 5, the insulating layer 6 also has through holes similar to the through holes 7 in the parts respectively opposite to the fuse elements 4. This arrangement makes it difficult for heat transferred to the heat radiation plate 5 to be transferred to the fuse elements 4 as well as for heat from the fuse elements 4 to be transferred to the heat radiation plate 5, resulting in stabilization of the fusing currents of the fuse elements 4.

The resin sealing body 8 is so configured as to have, in the portions opposite to the fuse elements 4, the concave portions 8A sinking from one main surface 8X of the resin sealing body 8 opposite to one main surface of each of the switching chips 3 toward the fuse elements 4 and the concave portions 8B sinking from the other main surface opposite to one main surface of the resin sealing body 8 toward the fuse elements 4. Since the semiconductor device 1A embodying the invention as described here is a package structure having the heat radiation plate 5, the concave portions 8B are formed through the through holes 7 provided in the heat radiation plate 5. Further in this embodiment, the concave portions 8A and the concave portions 8B are formed in a sufficient depth for the intermediate parts of the fuse elements 4 to be exposed from the bottoms of the concave portions. This arrangement makes it difficult for heat transferred to the resin sealing body 8 to be transferred to the fuse elements 4 as well as for heat from the fuse elements 4 to be transferred to the resin sealing body 8, resulting in stabilization of the fusing currents of the fuse elements 4.

The semiconductor device 1A configured in this way can be incorporated into, for instance as shown in FIG. 9, into an automobile circuit system. In FIG. 9, a reference numeral 50 denotes a power source (e.g., a 12 [V] battery), and 51, loads (e.g., motors to drive power windows, drive motors for intermittent window wipers, engine control system and lighting system) The semiconductor device 1A outputs from its control chip (control circuit) 2 switch drive signals for ON/OFF operation control of various switching chips (power MOSFETs) 3 on the basis of input signals, and thereby controls current supply to the loads 51.

Figure 10:
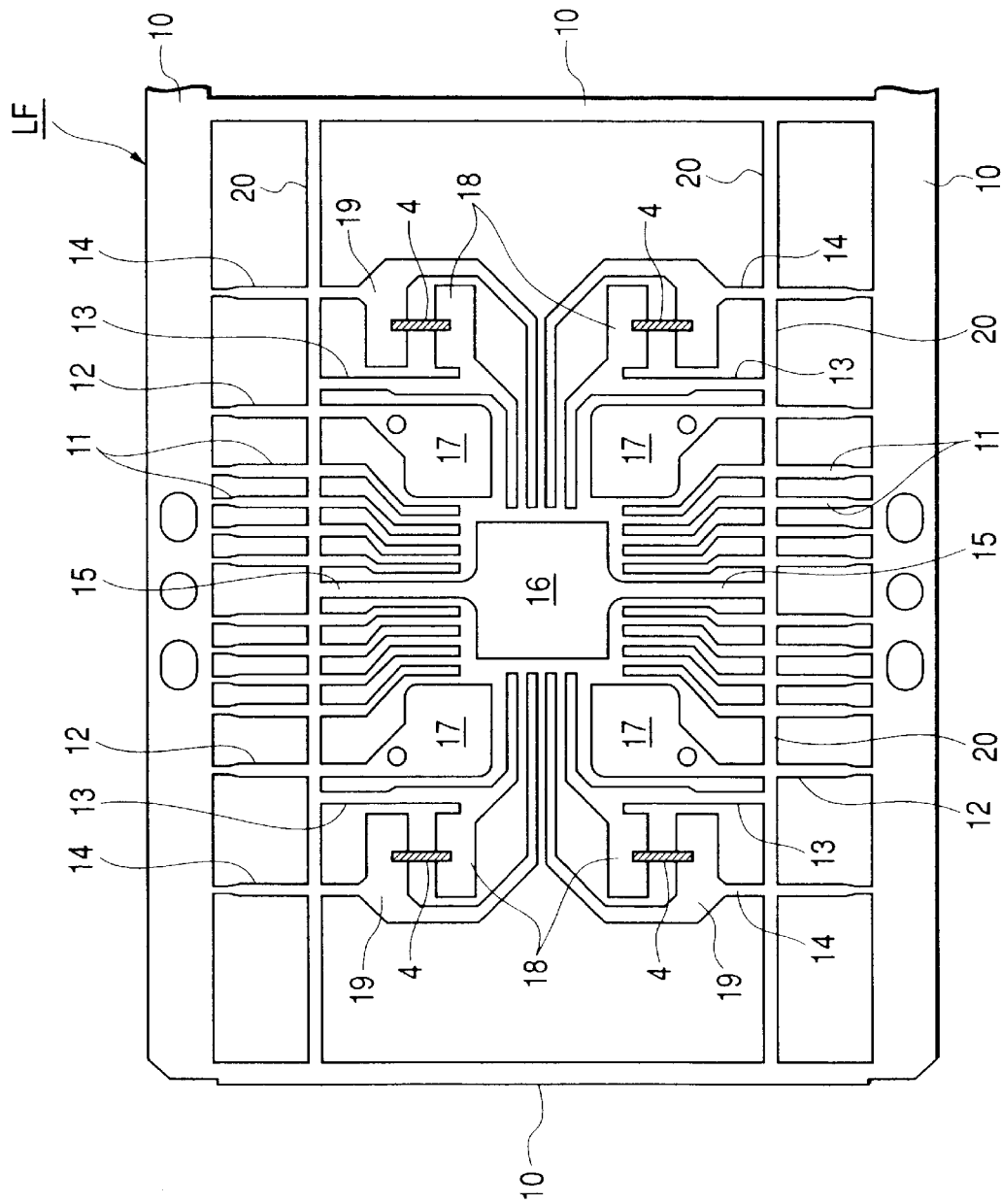
FIG. 10 is a schematic plan of a lead frame for use in the manufacture of the semiconductor device, which is Embodiment 1 of the invention.
Figure 11:
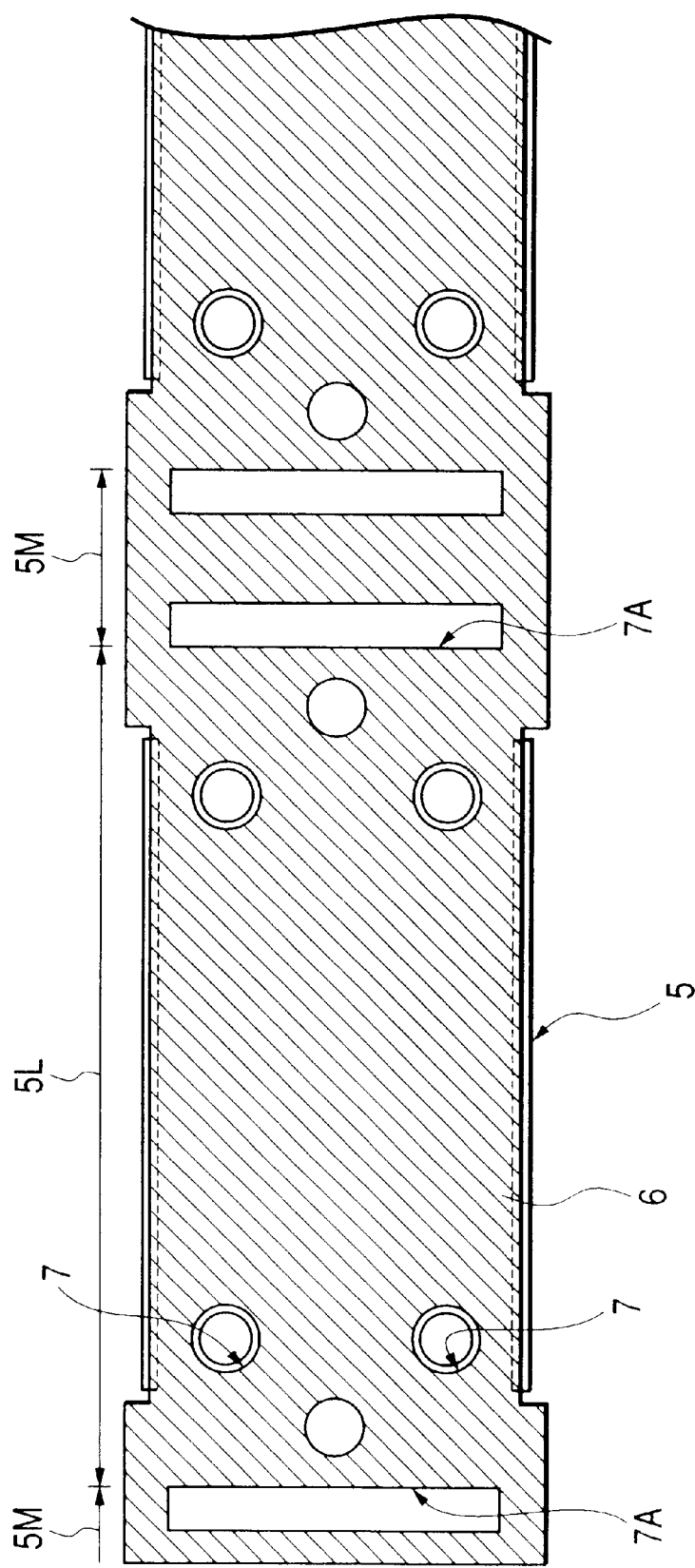
FIG. 11 is a schematic bottom plan of a heat radiation plate for use in the manufacture of the semiconductor device, which is Embodiment 1 of the invention.

Next will be described a lead frame and a heat radiation plate used in the manufacture of the semiconductor device 1A with reference to FIG. 10 and FIG. 11. FIG. 10 is a schematic plan of the lead frame, and FIG. 11, a schematic bottom plan of the heat radiation plate. Although an actual lead frame and heat radiation plate are serially structured to allow the manufacture of a plurality of semiconductor devices at a time, FIG. 10 and FIG. 11 illustrate only one region each for the manufacture of one semiconductor device to make the illustrations easier to understand.

As shown in FIG. 10, a lead frame LF has a configuration in which mainly a plurality of leads (11, 12, 13, 14, 15), one die pad 16, four die pads 17, four pads (18, 19) and the like are arranged in a lead arrangement region whose plane is defined quadrilaterally (in a rectangle in this embodiment) by a frame body 10.

The plurality of leads are divided into two groups of leads. One group of leads (eight leads 11 and two leads (12, 13, 14)) are arranged along one of the two opposing long sides of the frame body 10, and those of the other group of leads (eight leads 11 and two leads (12, 13, 14) are arranged along the other long side of the frame body 8.

In one of the lead groups, individual leads are integrated by a dam bar (also known as tie bar) 20, and leads 14 located at the initial and final stages of the lead arrangement are integrated with the short side portions of the frame body 10 by the dam bar 20. The outer portions of the other leads than the leads 13 and 15 are integrated with one long side portion of the frame body 10.

In the other lead group, individual leads are integrated by the dam bar 20, and leads 14 located at the initial and final stages of the lead arrangement are integrated with the short side portions of the frame body 10 by the dam bar 20. The outer portions of the other leads than the leads 13 and 15 are integrated with one long side portion of the frame body 10. Thus, the lead frame LF has a bidirectional lead arrangement structure.

The planar shape of the die pad 16 is quadrilaterally formed. The die pad 16 is formed integrated with each of two leads 15 arranged opposite to each other. Each of the die pads 17 is formed integrated with the matching lead 12; each of the die pads 18 is formed integrated with the matching lead 13; and each of the pads 19 is formed integrated with the matching lead 14. Each of the pads 18 is arranged near the matching pad 19.

The die pad 16 is disposed in the central portion of the lead arrangement region. The four die pads 17 are arranged around the die pad 16 so as to encircle the die pad 16. The four pads (18, 19), located farther out than the four die pads 17, are arranged around the die pad 16 so as to encircle the die pad 16. In this embodiment, the four die pads 17 are separately arranged outside the four corners of the die pad 16.

The four pads (18, 19) are separately arranged outside the four corners of the die pad 16 farther out than the die pad 17.

The lead frame LF is formed by either etching or pressing a planar sheet of, for instance, iron (Fe) -nickel (Ni) alloy, or Cu or a Cu ally into prescribed leads and pads. The lead frame LF is formed in a thickness of, for instance, about 0.45 [mm].

In this embodiment, the lead frame LF is configured to have four fuse elements 4. One end of each fuse element 4 is electrically and mechanically connected to the matching pad 18 and the other end is electrically and mechanically connected to the matching pad 19.

As shown in FIG. 11, the heat radiation plate 5 before being subjected to a manufacturing process has a configuration comprising a product portion 5L to be used as the product and removable portions SM to be cut and removed in the manufacturing process. The removable portions 5M are on both sides, in the lengthwise direction, of the product portion 5L. Over one main surface of the heat radiation plate 5 is formed the insulating layer 6 so as to cover this whole main surface.

In the product portion 5L of the heat radiation plate 5 are provided the four through holes 7 penetrating the heat radiation plate 5 from one of its main surfaces to the other, and the insulating layer 6 also has through holes similar to these through holes 7 in the parts respectively matching these through holes 7. The through holes 7 are disposed in positions opposite to the fuse elements 4. In the removable portion 5M of the heat radiation plate 5 are provided through holes 7A penetrating the heat radiation plate 5 from one of its main surfaces to the other, and the insulating layer 6 also has through holes similar to these through holes 7A in the parts respectively matching these through holes 7A. The through holes 7A are used for positioning when the heat radiation plate 5 is fitted to the mold die.

Incidentally, a package having the heat radiation plate 5 requires efficient transferring of heat from chips to the heat radiation plate. Efficient transferring of heat from chips to the heat radiation plate can be achieved by narrowing the gaps between the die pads (16, 17) on which the chips are mounted and the heat radiation plate 5. In this embodiment, as the insulating layer 6 is formed over one main surface of the heat radiation plate 5 to prevent the heat radiation plate 5 from coming into contact with the inner portions of the leads and the die pads on this main surface of the heat radiation plate 5, the gaps between the die pads and the insulating layer 6 should be kept as narrow as practicable. However, many fillers are mixed into the resin used for the formation of the resin sealing body 8 to reduce stress, if the gaps between the die pads and the insulating layer 6 are made too much narrower than the grain size of the fillers, the gaps between the die pads and the insulating layer 6 will fail to be filled with the resin, and the gaps will remain void. If void gaps are formed, the thermal resistance between the die pads and the insulating layer 6 will rather increase. Moreover, there will arise the trouble of crack generation in the resin sealing body, starting from the void gaps.

While the generation of such void gaps can be restrained by keeping the gaps between the die pads and the insulating layer 6 greater than the grain size of the fillers mixed into the resin, widening the gaps between the die pads and the insulating layer 6 too much would make it impossible to efficiently transfer the heat from the chips to the heat radiation plate 5. Therefore, it is desirable to keep the gaps between the die pads and the insulating layer 6 greater than the maximum grain size of the fillers mixed into the resin but narrower than the thickness of the die pads. In this embodiment, epoxy thermosetting resin containing many fillers whose grain size, for instance, 3 to 5 [μm] on the average and 25 [μm] at the maximum is used for the resin sealing body 8 and die pads of, for instance, about 0.45 [mm] in thickness are used, the gaps between the die pads and the insulating layer 6 are set to, for instance, around 0.2 [mm].

Figure 12:
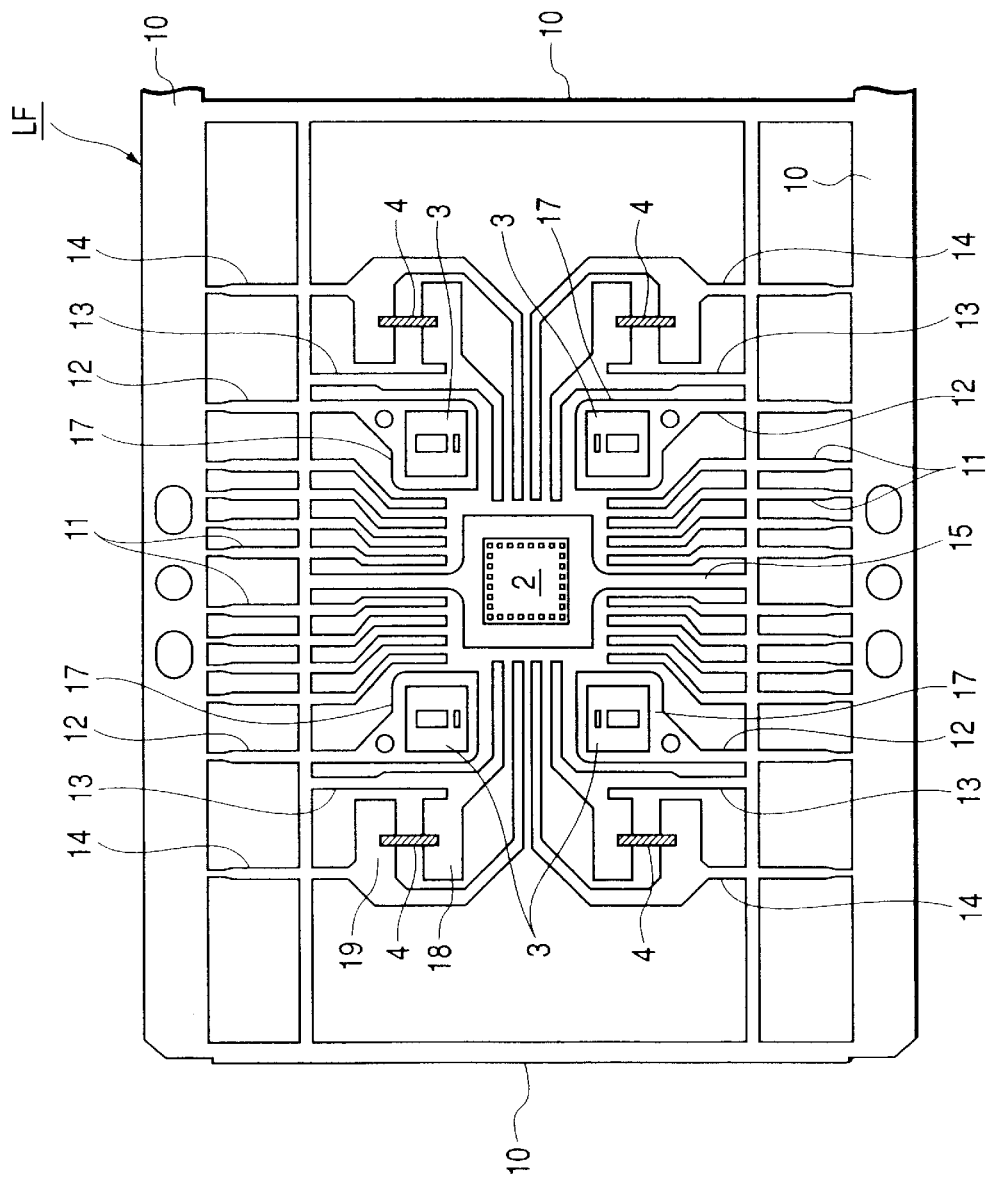
FIG. 12 is a schematic plan for describing the manufacture of the semiconductor device, which is Embodiment 1 of the invention.
Figure 13:
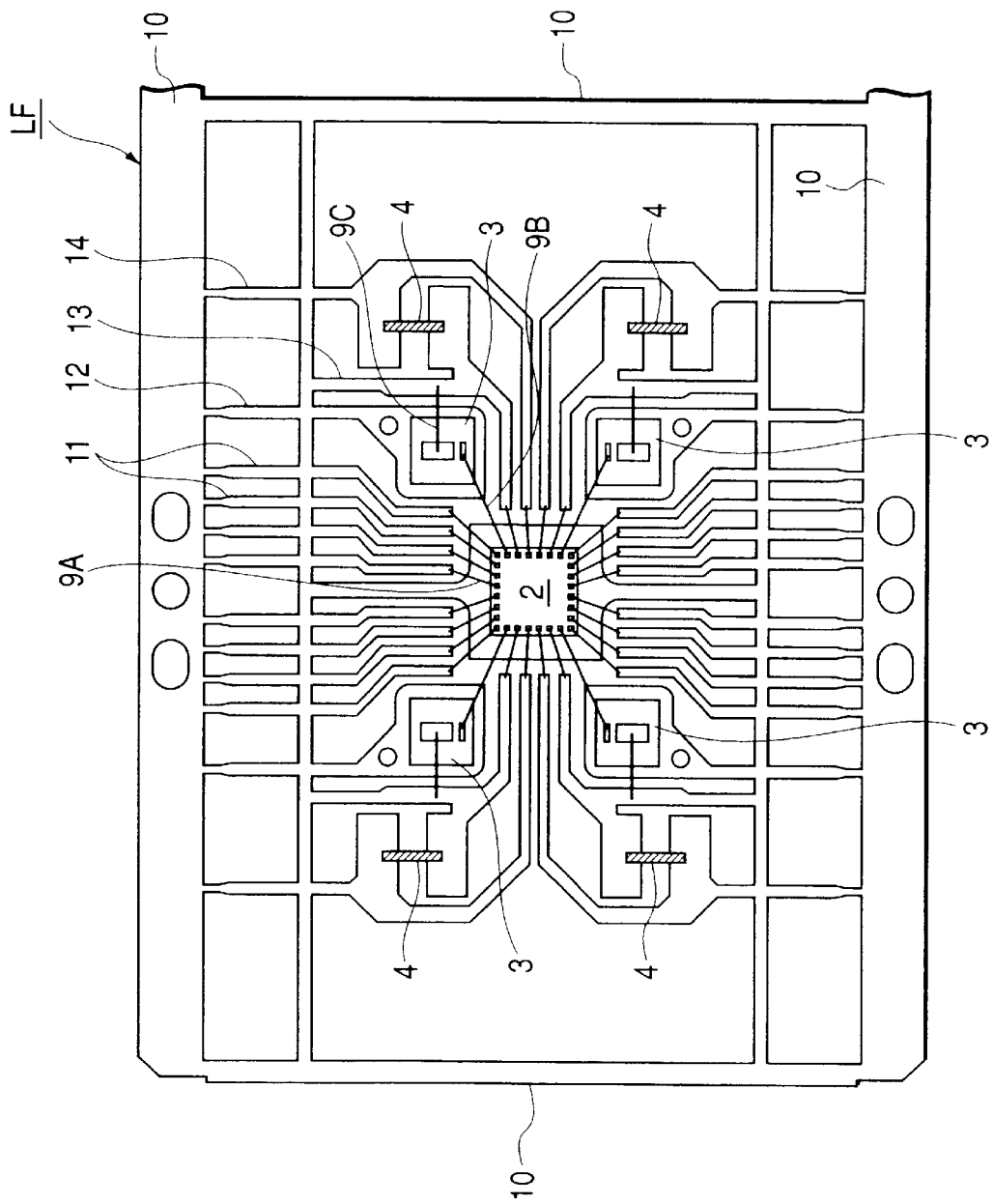
FIG. 13 is another schematic plan of a lead frame for use in the manufacture of the semiconductor device, which is Embodiment 1 of the invention.
Figure 14:
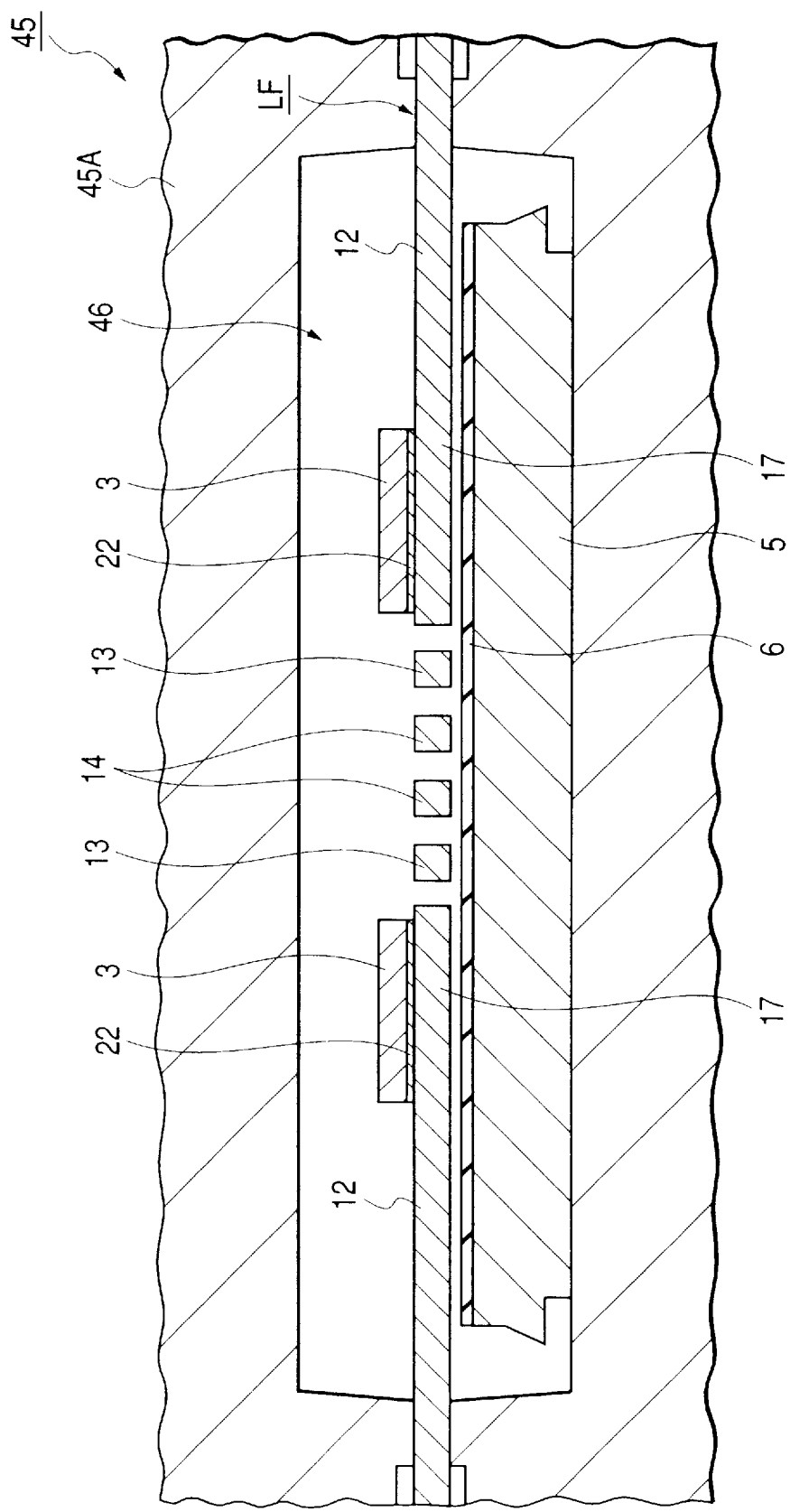
FIG. 14 is still another schematic plan of a lead frame for use in the manufacture of the semiconductor device, which is Embodiment 1 of the invention.
Figure 15:
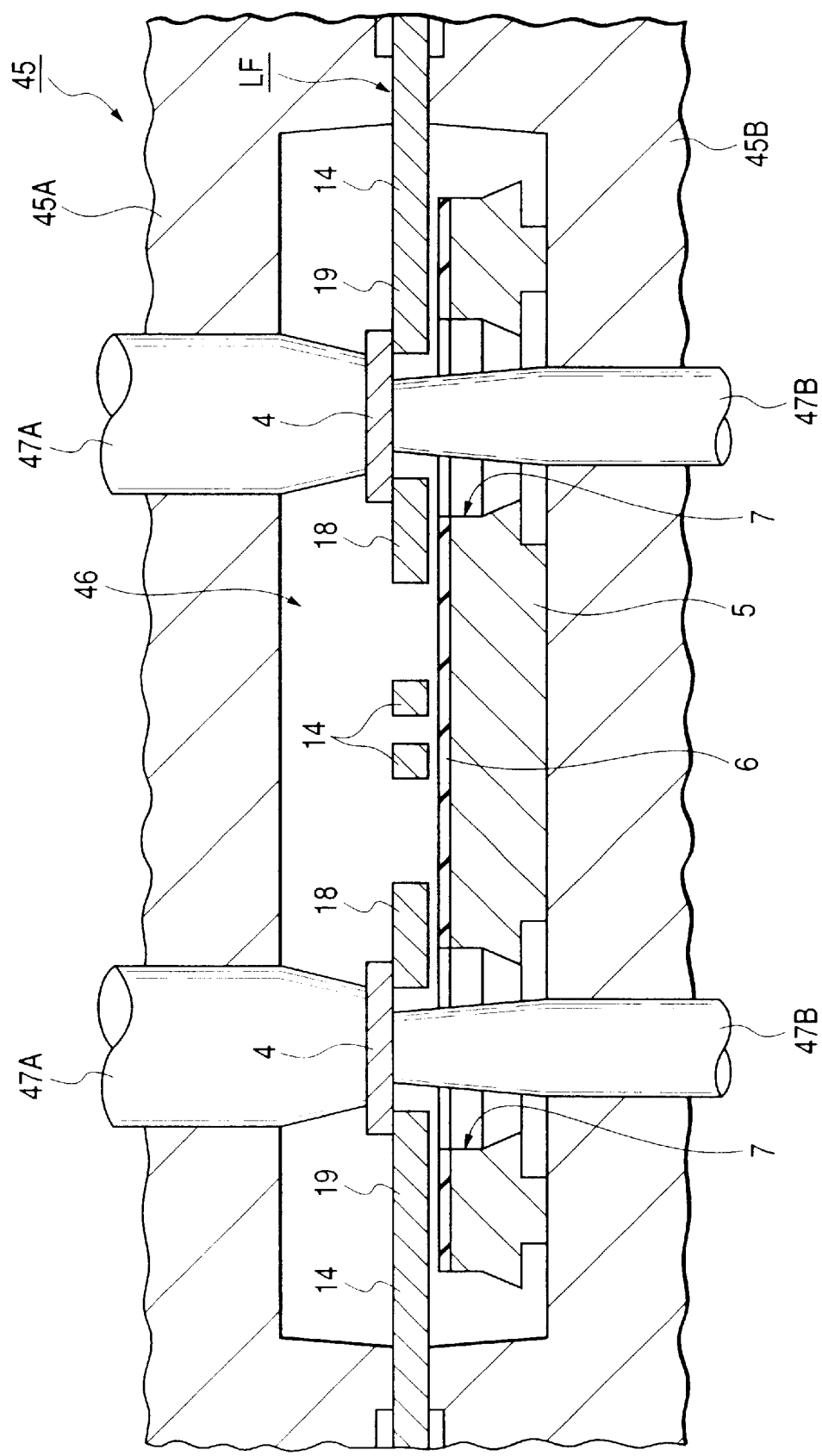
FIG. 15 is yet another schematic plan of a lead frame for use in the manufacture of the semiconductor device, which is Embodiment 1 of the invention.

Next will be described the manufacture of the semiconductor device 1A with reference to FIG. 12 through FIG. 15. FIG. 12 and FIG. 13 are schematic plans illustrating the manufacture, while FIG. 14 and FIG. 15 are schematic sections illustrating the manufacture.

First, the lead frame LF and the heat radiation plate 5 shown in FIG. 10 are prepared and, after that, the control chip 2 is adhered and fixed to the die pad 16 of the lead frame LF while the switching chips 3 are adhered and fixed to the respectively matching ones of the four die pads 17 of the lead frame LF. The die pad 16 and the control chip 2 are adhered and fixed to each other via the adhesive 21 applied between one main surface of the die pad 16 and the back surface of the control chip 2. The die pads 17 and the switching chips 3 are adhered and fixed to each other via the adhesive 22 applied between the die pads 17 and the drain electrodes 42 on the back surfaces of the switching chips 3.

Next, the tips of the inner portions of the leads (11, 13, 14) are electrically connected to the respectively matching electrodes 2A of the control chip 2 with the bonding wires 9A; the gate electrodes 40 of the switching chips 3 are electrically connected to the respectively matching electrodes 2A of the control chip 2 with the bonding wires 9B; and the source electrodes 41 of the switching chips 3 are electrically connected to the central parts of the inner portions of the respectively matching leads 13 with the bonding wires 9C.

In this process, as the four switching chips 3 are arranged around the control chip 2 at substantially equal distances from the control chip 2, none of the bonding wires 9B is excessively longer than any other bonding wire 9B.

Therefore, short circuiting due to the hanging of any bonding wire 9B can be restrained.

Next, as shown in FIG. 14 and FIG. 15, the lead frame LF and the heat radiation plate 5 are positioned between an upper die 45A and a lower die 45B of a mold die 45. Then, within a cavity 46 formed by the upper die 45A and the lower 45B, the control chip 2, switching chips 3, fuse elements 4, heat radiation plate 5, inner portions of the leads (11, 12, 13, 14, 15), die pads (16, 17), pads (18, 19), bonding wires (9A, 9B, 9C) and so forth are arranged. The lead frame LF and the heat radiation plate 5 are so positioned as to arrange the inner portions of the leads, die pads and pads over one main surface (the surface over which the insulating layer 6 is formed) of the heat radiation plate 5. They are also so positioned as to leave some gaps between the inner portions of the leads, die pads and pads on the one hand and the insulating layer 6 on the other. The gaps are kept greater than the maximum grain size of the fillers mixed into the resin used for forming the resin sealing body but narrower than the thickness of the lead frame LF (die pads). In this embodiment, the gaps are set to, for instance, around 0.2 [mm].

In this embodiment, the mold die 45 has a configuration in which there are, in its portions opposite to the fuse elements 4, protruding portions 47A protruding from the inner wall face side of the cavity 46 opposite to the fuse elements 4 toward the switching chips 3 and protruding portions 47B protruding from the inner wall face side of the cavity 46 opposite to the back surfaces of die pads and the back surfaces of the heat radiation plate 5 toward the fuse elements 4. The protruding portions 47A and 47B have mechanisms to allow adjustment of the extents of protrusion from the inner wall face side of the cavity 46 toward the fuse elements 4.

Next, the intermediate portions of the fuse elements 4 are held between the protruding portions 47A and 47B from above and underneath.

Then, in this state, fluid resin is poured under pressure from the pot of the mold die 45 through the runner and the inlet gate into the cavity 46 to form the resin sealing body 8.

In this process, the control chip 2, switching chips 3, fuse elements 4, plurality of bonding wires (9A, 9B, 9C), respective inner portions of the plurality of lead (11, 12, 13, 14, 15), die pad 16, die pads 17, pads (18, 19) and so forth are sealed by the resin sealing body 8.

Also in this process, there is formed the resin sealing body 8 having, in the portions opposite to the fuse elements 4, the concave portions 8A sinking from one main surface 8X of the resin sealing body 8 opposite to one main surface of each of the switching chips 3 toward the fuse elements 4 and the concave portions 8B sinking from the other main surface opposite to one main surface of the resin sealing body 8 through the through holes 7 toward the fuse elements 4. The concave portions 8A and the concave portions 8B are formed in a sufficient depth for the intermediate ports of the fuse elements 4 to be exposed from the bottoms of the concave portions.

Further in this process, as any of the bonding wires 9B is substantially prevented from becoming excessively longer than any other bonding wire 9B, the occurrence of short circuiting trouble due to any wire flow of the bonding wire 9B can be restrained.

Also in this process, since gaps between the inner portions of the leads, die pads and pads on the one hand and the insulating layer 6 on the other are kept greater than the maximum grain size of the fillers mixed into the resin, no void gaps due to the resin mixed into the fillers occur between them.

The foregoing is followed by, among others, a cutting process to cut and remove the dam bar 20 formed integrated with leads, another cutting process to cut the tips of the outer portions of leads off the frame body 10 of the lead frame LF, a shaping process to bend the outer portions of leads, and a process to duct and remove the removable portion of the heat radiation plate 5 together with the insulating layer 6. These processes result in substantial completion of the semiconductor device 1A shown in FIG. 1 through FIG. 6.

This embodiment of the invention described so far provides the following advantages.

(1) In the semiconductor device 1A, the control chip 2 is arranged in the central portion of the resin sealing body 8, and the four switching chips 3 are arranged on the periphery of the control chip 2.

As this configuration results in lower thermal resistance on the periphery of the resin sealing body 8 than in its central portion, heat generated by the switching chips 3, which is greater than that generated by the control chip 2 can be efficiently discharged out of the resin sealing body 8. As a result, heat radiation performance of the semiconductor device 1A can be enhanced.

Also, as the four switching chips 3 can be disposed at substantially equal distances from the control chip 2, the length of the bonding wire 9B to electrically connect one electrode 2A of the control chip 2 to the gate electrode 40 of one switching chip 3 is kept from becoming excessively longer than those of the other bonding wires 9B electrically connecting the electrodes 2A of the control chip 2 to the gate electrodes 40 of the other switching chips 3. As a result, short circuiting trouble due to the hanging of any bonding wire 9B can be restrained and, when the resin sealing body 8 is formed by the transfer mold process, short circuiting trouble of any wire flow of the bonding wires 9B due to the fluidity of the resin injected under pressure into the cavity of the mold die can be restrained, resulting in an improved yield of the manufacturing process of the semiconductor device 1A.

(2) In the semiconductor device 1A, the four switching chips 3 are arranged symmetrically with respect to the control chip 2 In this embodiment, the four switching chips 3 are separately arranged outside the four corners of the control chip 2.

As this configuration secures ample spacing between the switching chips 3, making it possible to restrain thermal interference between adjacent switching chips 3 and to improve thermal balance within the resin sealing body 8. As a result, the reliability of the semiconductor device 1A can be enhanced.

(3) In the semiconductor device 1A, the four fuse elements 4 are arranged around the control chip 2 farther out than the switching chips 3.

This configuration serves to reduce the lengths of the bonding wires 9B electrically connecting the electrodes 2A of the control chip 2 to the gate electrodes 40 of the switching chips 3 compared with the lengths that would be required in the arrangement of the fuse elements 4 between the control chip 2 and the switching chips 3, thereby facilitating faster ON/OFF operation control of the power MOSFET.

Also, the reduced lengths of the bonding wires 9B serves to reduce short circuiting trouble due to the hanging of any bonding wire 9B and short circuiting trouble due to wire fluidity.

Further, compared with the hypothetical case in which the fuse elements 4 are arranged between the control chip 2 and the switching chips 3, the thermal impact on the fuse elements 4 of heat generated by the chips can be restrained, and accordingly the fusing currents of the fuse elements 4 can be stabilized, with the result that the reliability of the semiconductor device 1A can be enhanced.

(4) In the semiconductor device 1, the four fuse elements 4 are arranged symmetrically with respect to the control chip 2. In this embodiment, the four fuse elements 4 are separately arranged outside the four corners of the control chip 2 farther out than the switching chips 3. This configuration secures ample spacing between the fusing elements 4, making it possible to restrain thermal interference between adjacent fuse elements 4, with the result that the reliability of the semiconductor device 1A can be enhanced.

(5) In the semiconductor device 1A, the die pad 16 to which the control chip 2 is adhered and fixed is separated from the four die pads 17 to which the four switching chips 3 are adhered and fixed from one another, and this configuration makes it difficult for heat from thee switching chips 3 to be transferred to the control chip 2, and thereby facilitates restraining of the impact of heat from thee switching chips 3 on the control chip 2. As a result, the reliability of the semiconductor device 1A can be enhanced.

(6) In the semiconductor device 1A, the four die pads 17 to which the four switching chips 3 are adhered and fixed are separated from one another. This configuration makes it difficult for heat from any one switching chip 3 to be transferred to the other switching chips 3, and thereby facilitates restraining of the impact of heat from any one switching chip 3 on the other switching chips 3. As a result, the reliability of the semiconductor device 1A can be enhanced.

(7) In the semiconductor device 1A, the heat radiation plate 5 is provided, in its portion opposite to the fuse elements 4, with the through holes 7 penetrating the heat radiation plate 5 from one of its main surfaces to the other. This configuration makes it difficult for heat transferred to the heat radiation plate 5 to be transferred to the fuse elements 4 and the heat from the fuse elements 4 to be transferred to the heat radiation plate 5, and thereby facilitates stabilization of the fusing currents of the fuse elements 4. As a result, the reliability of the semiconductor device 1A can be enhanced.

(8) In the semiconductor device 1A, the resin sealing body 8 has, in the portions opposite to the fuse elements 4, the concave portions 8A sinking from one main surface 8X of the resin sealing body 8 opposite to one main surface of each of the switching chips 3 toward the fuse elements 4 and the concave portions 8B sinking from the other main surface opposite to one main surface of the resin sealing body 8 toward the fuse elements 4. As this configuration makes it difficult for heat transferred to the resin sealing body 8 to be transferred to the fuse elements 4 as well as for heat from the fuse elements 4 to be transferred to the resin sealing body 8, resulting in stabilization of the fusing currents of the fuse elements 4.

(9) In the manufacture of the semiconductor device 1A, in a state in which gaps greater than the maximum grain size of the fillers but narrower than the thickness of the lead frame are kept between the inner portions of the leads (11, 12, 13, 14, 15), die pads (16, 17) and pads (18, 19) on the one hand and the insulating layer 6 on the other, the control chip 2, switching chips 3, fuse elements 4, bonding wires (9A, 9B, 9C), inner portions of the leads, die pads, pads and so forth are arranged within the cavity 46 of the mold die 45 and, after that, resin in which many fillers are mixed is injected under pressure into the cavity 46 to form the resin sealing body 8.

This makes it possible to reduce thermal resistance between the inner portions of the leads (11, 12, 13, 14, 15), die pads (16, 17) and pads (18, 19) on the one hand and the insulating layer 6 on the other without generating void gaps between them, and accordingly to manufacture the semiconductor device 1A excelling in heat radiation.

(10) In the manufacture of the semiconductor device 1A, the control chip 2, switching chips 3, fuse elements 4, bonding wires (9A, 9B, 9C), inner portions of the leads (11, 12, 13, 14, 15), die pads (16, 17), pads (18, 19) and so forth are arranged within the cavity 46 of the mold die 45 and, in a state in which the protruding portions 47A protruding from the inner wall face side of the cavity 46 opposite to one main surface of the switching chips 3 toward the fuse elements 4 and protruding portions 47B protruding from the inner wall face side of the cavity 46 opposite to the back surfaces of the die pads (16, 17) and the back surface of the heat radiation plate 5 toward the fuse elements 4 are arranged, the resin sealing body 8 is formed by injecting resin under pressure into the cavity 46.

As this makes possible formation of the resin sealing body 8 having the protruding portions 47A and 47B, the semiconductor device 1A having highly reliable fuse elements 4 whose fusing currents can be manufacture.

Incidentally, while the embodiment described here uses the lead frame LF in which the fuse elements 4 are connected to the pads in advance, the fuse elements 4 may as well be connected in the assembling process of the semiconductor device.

Also, while the embodiment described here has a configuration in which the resin sealing body 8 is provided with both the concave portions 8A and the concave portions 8B, the resin sealing body 8 may have only either the concave portions 8A or the concave portions 8B.

Further, while this embodiment described here uses the switching chips 3 each of which has the gate electrode and the source electrode on one main surface and the drain electrode on the other main surface, each switching chip may as well have the gate electrode and the drain electrode on one main surface and the source electrode on the other main surface.

Also, while this embodiment described here uses the switching chips 3 each having a vertically structured power MOSFET built into it, each switching chip 3 may as well have a horizontally structured power MOSFET built into it.

Further, while this embodiment described here uses the switching chips 3 with built-in power MOSFETs as insulating gate type field effect transistors, switching chips 3 with built-in power MISFETs (Metal Insulator Semiconductor Field Effect Transistors) may as well be used.

Also, while this embodiment described here uses power MOSFETs as switching elements, switching chips with built-in power bipolar transistors or power IGBTs (Insulated Gate Bipolar Transistors) may as well be used.

Further, the four switching chips 3 used in this embodiment described here have the same structure and the same functions, the four switching chips may as well have different structures and different functions.

Also, the four fuse elements 4 used in this embodiment described here have the same structure and the same functions, the four fuse elements 4 may as well have different structures and different functions.

(Embodiment 2 )

Figure 16:
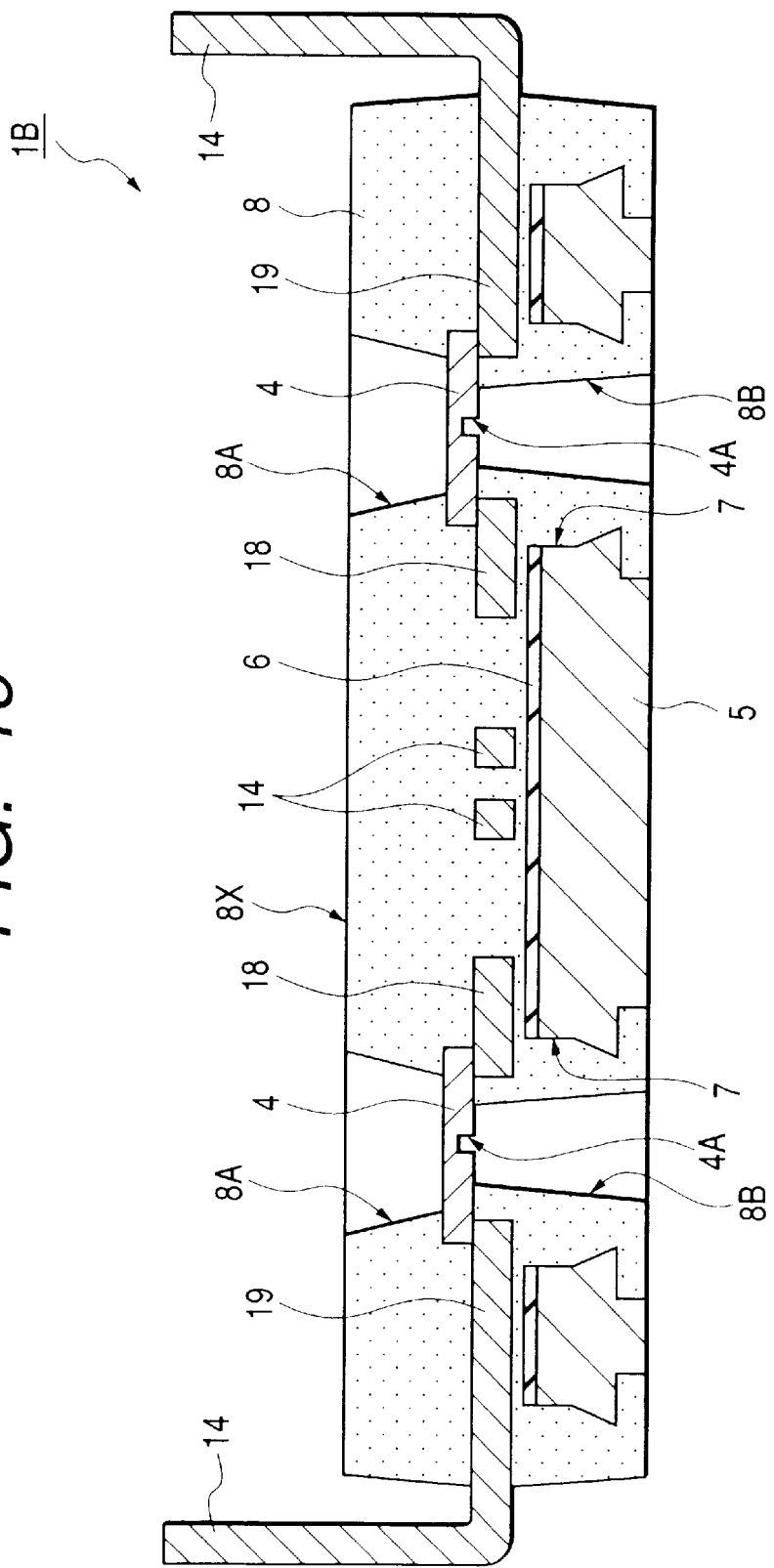
FIG. 16 is a schematic section of a semiconductor device, which is Embodiment 2 of the invention.

FIG. 16 is a schematic section of a semiconductor device, which is Embodiment 2 of the present invention.

As shown in FIG. 16, a semiconductor device 1B embodying the invention in this way has basically the same configuration as Embodiment 1 described except in the following aspects.

Thus, each fuse element 4 has a smaller sectional area in one intermediate portion 4A than elsewhere. In this embodiment, a groove is formed in the portion 4A to reduce the sectional area of that portion. This configuration serves to fix the fusible portion of the fuse element 4 in one location, and thereby contributes to further stabilizing the fusing current of the fuse element 4. Alternatively, the sectional area of the portion 4A can be made smaller by reducing its width.

(Embodiment 3 )

Figure 17:
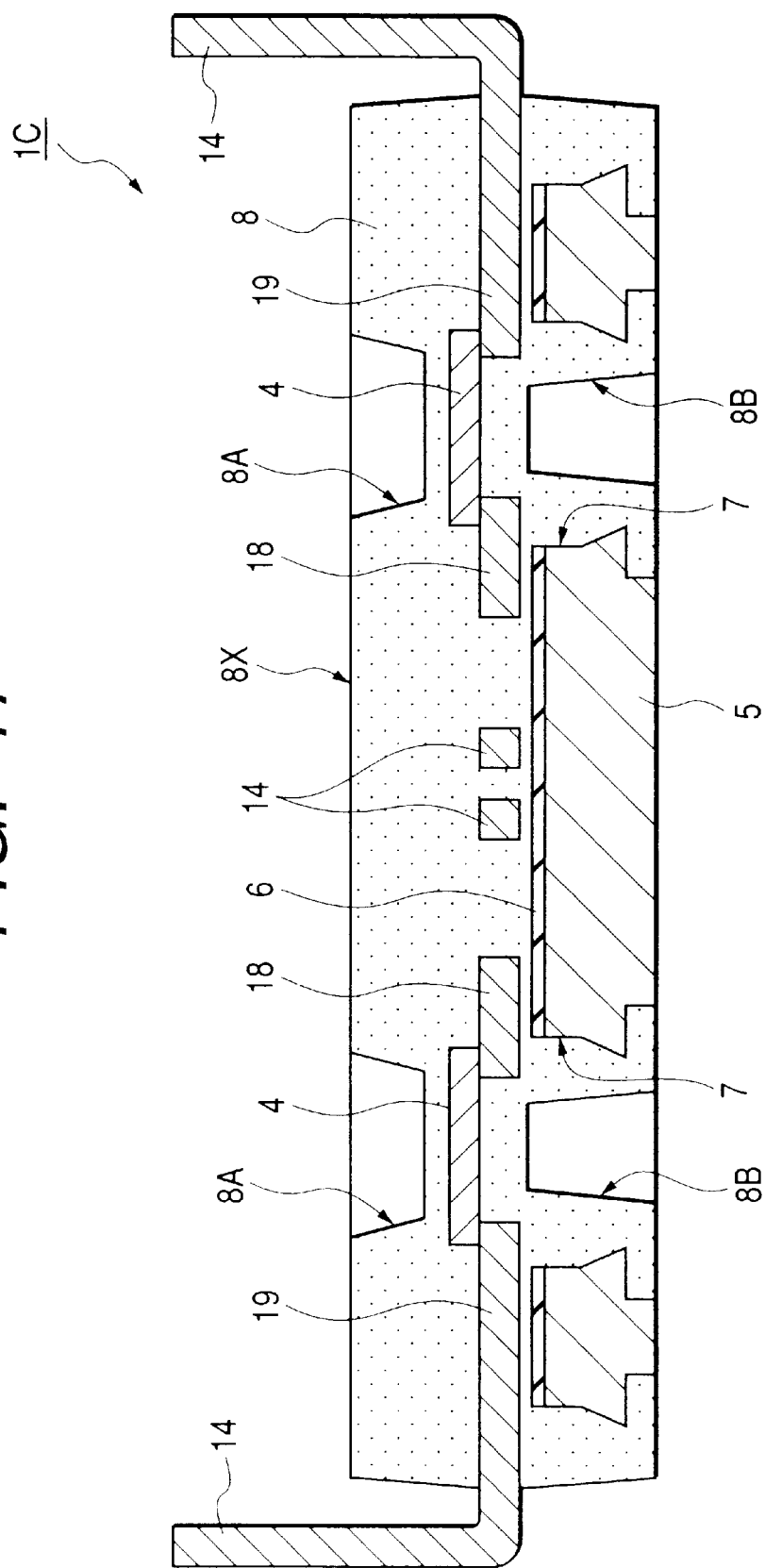
FIG. 17 is a schematic bottom plan of the semiconductor device, which is Embodiment 3 of the invention.

FIG. 17 is a schematic bottom plan of the semiconductor device, which is Embodiment 3 of the present invention.

As shown in FIG. 17, a semiconductor device 1C embodying the invention in this way has basically the same configuration as Embodiment 1 described except in the following aspects.

Thus, each of the concave portions 8A and the concave portions 8B is formed in such a depth that the resin of the resin sealing body 8 intervenes between its bottom surface and the intermediate portion of a fuse element 4 (such a depth that its bottom surface is isolated from the intermediate portion of the fuse element 4). Such concave portions 8A and concave portions 8B can be readily formed by adjusting the extents of protrusion of the protruding portions 47A and 47B (see FIG. 15) during the formation process of the resin sealing body.

This configuration, like that of Embodiment 1 described above, can help stabilize the fusing currents of the fuse elements 4.

Further, since adjustment of the extents of protrusion of the protruding portions 47A and 47B makes possible adjustment of the depths of the concave portions 8A and the concave portions 8B, the fusing currents of the fuse elements 4 can be controlled with the depths of the concave portions 8A and the concave portions 8B.

(Embodiment 4 )

Figure 18:
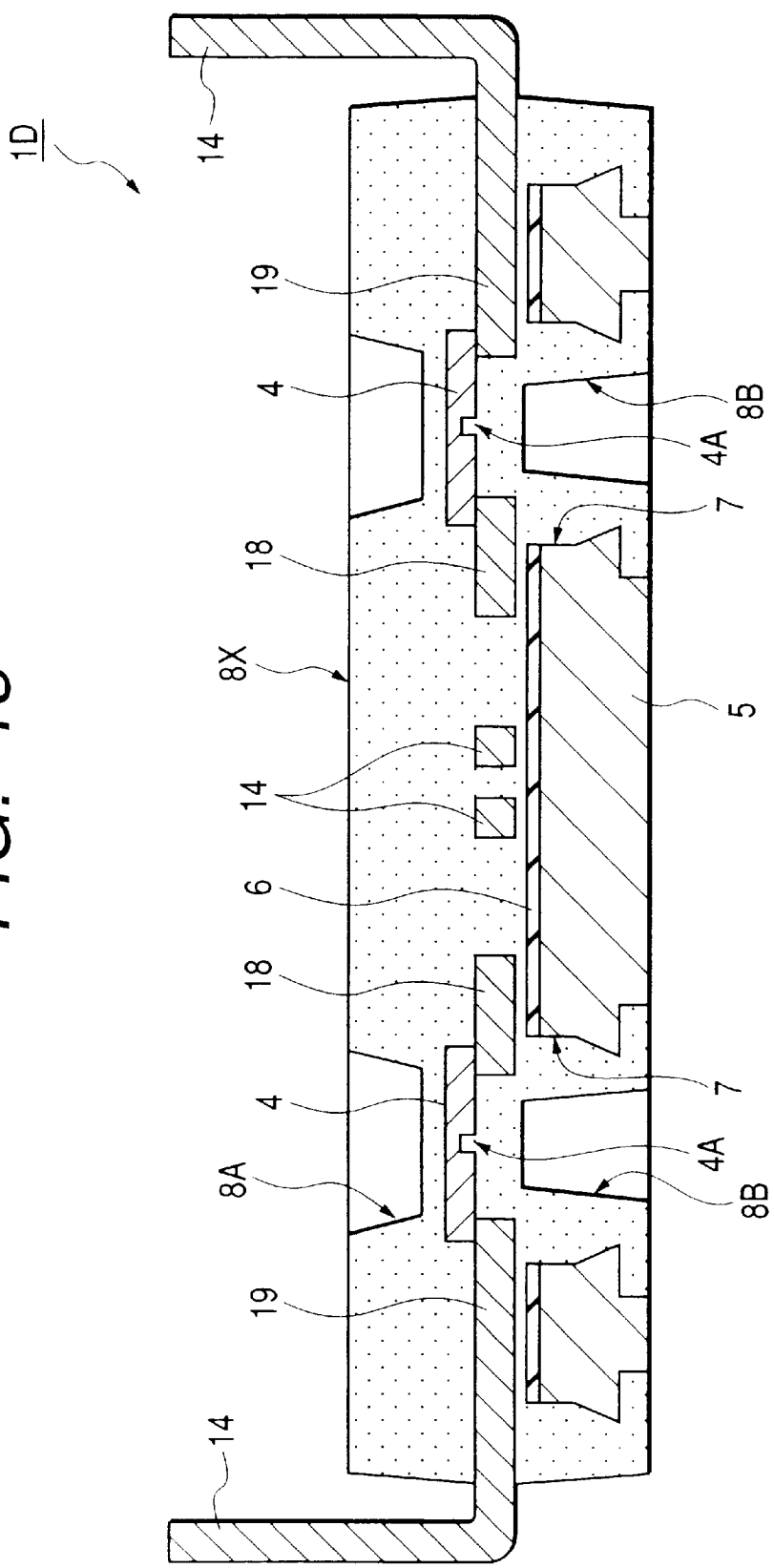
FIG. 18 is a schematic section of the semiconductor device, which is Embodiment 4 of the invention.

FIG. 18 is a schematic section of the semiconductor device, which is Embodiment 4 of the present invention.

As shown in FIG. 18, a semiconductor device 1D embodying the invention in this way has basically the same configuration as Embodiment 3 described except in the following aspects.

Thus, each fuse element 4, as in Embodiment 2 described above, has a smaller sectional area in one intermediate portion 4A than elsewhere. This configuration contributes to further stabilizing the fusing current of the fuse element 4.

(Embodiment 5 )

Figure 19:
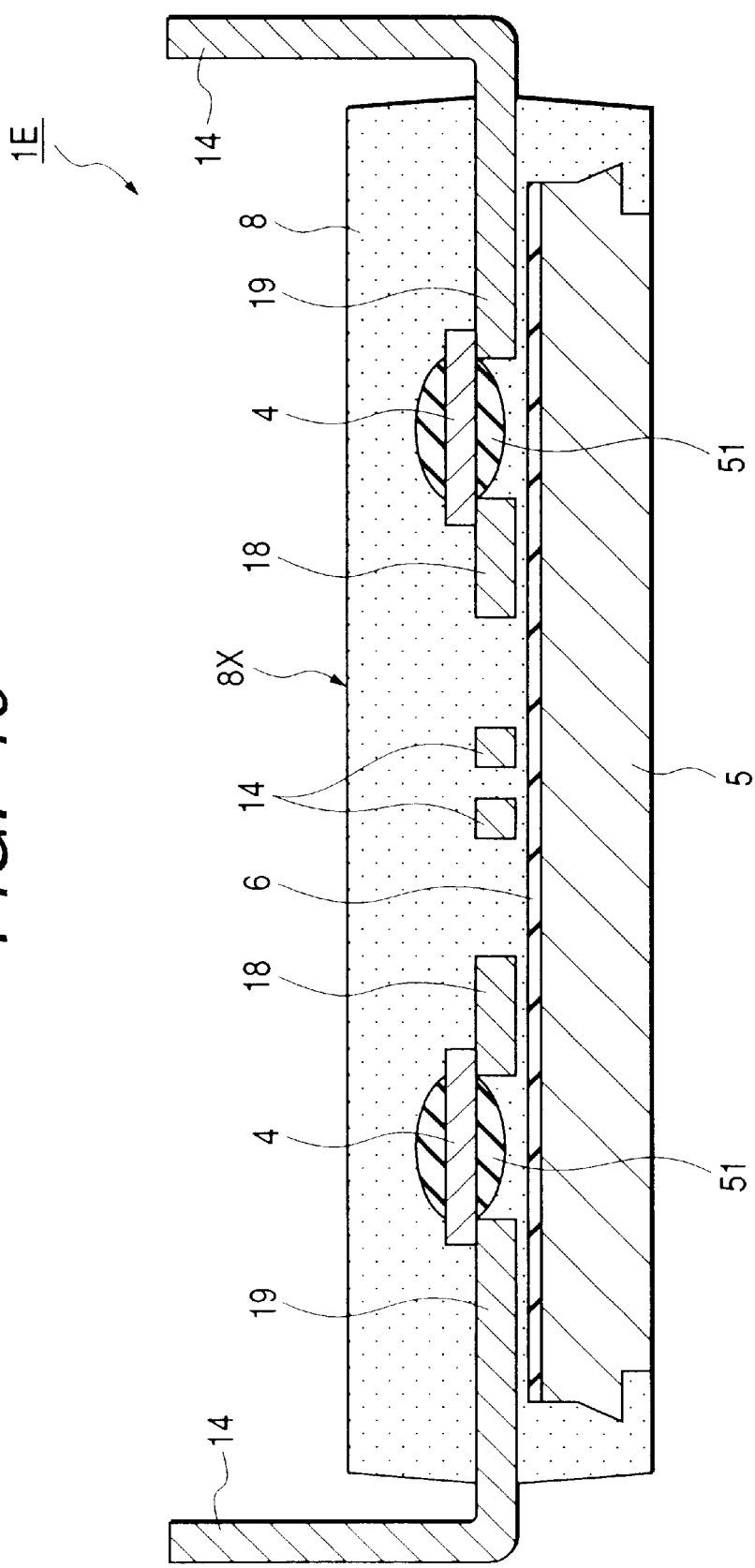
FIG. 19 is a schematic section of the semiconductor device, which is Embodiment 5 of the invention.

FIG. 19 is a schematic section of the semiconductor device, which is Embodiment 5 of the present invention.

As shown in FIG. 19, a semiconductor device 1E embodying the invention in this way has basically the same configuration as Embodiment 1 described except in the following aspects.

Thus an intermediate portion of each fuse element 4 is coated with a resin 51 having a lower thermal conductivity than the resin of the resin sealing body 8. As the resin 51, for instance, a silicon resin having a thermal conductivity of about 0.2 [W/mK] is used. This configuration makes it difficult for heat transferred to the resin sealing body 8 to be transferred to the fuse elements 4 as well as for heat from the fuse elements 4 to be transferred to the resin sealing body 8, resulting in stabilization of the fusing currents of the fuse elements 4.

(Embodiment 6 )

FIG. 20 is a schematic section of the semiconductor device, which is Embodiment 6 of the present invention.

As shown in FIG. 20, a semiconductor device 1E embodying the invention in this way has basically the same configuration as Embodiment 1 described except in the following aspects.

Thus the pads 18 and 19 are exposed from the bottom surfaces of the concave portions 8A and the concave portions 8B, and no fuse elements are connected to the pads 18 and 19.

This configuration enables the fuse elements and other components to be connected to the pads 18 and 19 after the resin sealing body 8 has been formed.

While the invention made by the present inventors have been described in specific terms with reference to the above-cited preferred embodiments thereof, the invention is by no means limited to these embodiments, but obviously can be modified in many different ways without deviating from its true spirit and scope.

What is claimed is:

1. A semiconductor device comprising:
   a first semiconductor chip having a control circuit;
   a plurality of second semiconductor chips each having a switching element; and
   a resin sealing body, whose plane is formed in a quadrilateral shape, for sealing said first semiconductor chip and said plurality of second semiconductor chips, wherein:
   said first semiconductor chip is arranged in the central portion of said resin sealing body away from the periphery of the same; and
   said plurality of second semiconductor chips are arranged on a periphery of said first semiconductor chip.

2. A semiconductor device comprising:
   a first semiconductor chip having on one main surface a control circuit and a plurality of electrodes;
   a plurality of second semiconductor chips each having on one main surface a switching element and an electrode;
   a plurality of bonding wires for electrically connecting the plurality of electrodes of said first semiconductor chip and respective electrodes of said plurality of second semiconductor chips; and
   a resin sealing body for sealing said first semiconductor chip, said plurality of second semiconductor chips and said plurality of bonding wires, wherein:
   said first semiconductor chip is arranged in the central portion of said resin sealing body away from the periphery of the same; and
   said plurality of second semiconductor chips are arranged on a periphery of said first semiconductor chip.

3. The semiconductor device, as claimed in claim 2, wherein:
   said plurality of second semiconductor chips are arranged so as to encircle said first semiconductor chip.

4. The semiconductor device, as claimed in claim 2, wherein:
   said plurality of second semiconductor chips are arranged symmetrically relative to said first semiconductor chip.

5. A semiconductor device comprising:
   a first semiconductor chip which has a control circuit and whose plane is formed in a quadrilateral shape;
   four second semiconductor chips each having a switching element; and
   a resin sealing body for sealing said first semiconductor chip and said four second semiconductor chips, wherein:
   said first semiconductor chip is arranged in the central portion of said resin sealing body; and
   said four second semiconductor chips are separately arranged outside the four corners of said first semiconductor chip.

6. A semiconductor device comprising:
   a first semiconductor chip which has on one main surface a control circuit and a plurality of electrodes and whose plane is formed in a quadrilateral shape;
   four second semiconductor chips each having on one main surface a switching element and an electrode;
   a plurality of bonding wires for electrically connecting the plurality of electrodes of said first semiconductor chip to respective electrodes of said four second semiconductor chips; and
   a resin sealing body for sealing said first semiconductor chip, said four second semiconductor chips and said plurality of bonding wires, wherein:
   said first semiconductor chip is arranged in the central portion of said resin sealing body; and
   said second semiconductor chips are separately arranged outside the four corners of said first semiconductor chip.

7. The semiconductor device, as claimed in claim 5, wherein:
   the ON/OFF operation of each of said switching elements is controlled by said control circuit.

8. The semiconductor device, as claimed in claim 7, wherein:
   each of said switching elements is an insulating gate type field effect transistor comprising a plurality of transistor cells connected in parallel.

9. The semiconductor device, as claimed in claim 8, further including:
   a heat radiation plate fixed to said resin sealing body, wherein:
   said first semiconductor chip and said four second semiconductor chips are arranged on one main surface of said heat radiation plate.

10. A semiconductor device comprising:
    a first semiconductor chip having a control circuit;
    a plurality of second semiconductor chips having said switching elements;
    a plurality of fuse elements whose fusible portions are fused by their own heat when an overcurrent flows; and
    a resin sealing body for sealing said first semiconductor chip, said plurality of second semiconductor chips and said plurality of fuse elements, wherein:
    said first semiconductor chip is arranged in the central portion of said resin sealing body;
    said plurality of second semiconductor chips are arranged on a periphery of said first semiconductor chip, and
    said plurality of fuse elements are arranged on a periphery of said first semiconductor chip and farther out than said second semiconductor chips.

11. A semiconductor device comprising:
    a first semiconductor chip having a control circuit and a plurality of electrodes on one main surface;
    a plurality of second semiconductor chips each having a fuse element and an electrode on one main surface;
    a plurality of fuse elements whose fusible portions are fused by their own heat when an overcurrent flows;
    a plurality of bonding wires for electrically connecting the plurality of electrodes of said first semiconductor chip to respective electrodes of said plurality of second semiconductor chips, and a resin sealing body for sealing said first semiconductor chip, said plurality of second semiconductor chips and said plurality of bonding wires, wherein:

said first semiconductor chip is arranged in the central portion of said resin sealing body;

said plurality of second semiconductor chips are arranged on a periphery of said first semiconductor chip, and said plurality of fuse elements are arranged on a periphery of said first semiconductor chip and farther out than said second semiconductor chips.

12. The semiconductor device, as claimed in claim 11, wherein:

said plurality of second semiconductor chips and said plurality of fuse elements are arranged so as to encircle said to said first semiconductor chip.

13. The semiconductor device, as claimed in claim 11, wherein:

said plurality of second semiconductor chips and said plurality of fuse elements are arranged symmetrically relative to said first semiconductor chip.

14. A semiconductor device comprising:

a first semiconductor chip which has a control circuit and whose plane is formed in a quadrilateral shape;

four second semiconductor chips each having a switching element;

four fuse elements whose fusible portions are fused by their own heat when an overcurrent flows; and a resin sealing body for sealing said first semiconductor chip, said four second semiconductor chips and four fuse elements, wherein:

said first semiconductor chip is arranged in the central portion of said resin sealing body;

said four second semiconductor chips are separately arranged outside the four corners of said first semiconductor chip; and said four fuse elements are separately arranged outside the four corners of said first semiconductor chip and farther out than said second semiconductor chips.

15. A semiconductor device comprising:

a first semiconductor chip having on one main surface a control circuit and a plurality of electrodes;

four second semiconductor chips each having on one main surface a switching element and an electrode;

four fuse elements whose fusible portions are fused by their own heat when an overcurrent flows;

a plurality of bonding wires for electrically connecting the plurality of electrodes of said first semiconductor chip to respective electrodes of said four second semiconductor chips; and a resin sealing body for sealing said first semiconductor chip, said four second semiconductor chips, said four fuse elements and said plurality of bonding wires, wherein:

said first semiconductor chip is arranged in the central portion of said resin sealing body;

said second semiconductor chips are separately arranged outside the four corners of said first semiconductor chip said four fuse elements are separately arranged outside the four corners of said first semiconductor chip and farther out than said second semiconductor chips.

16. The semiconductor device, as claimed in claim 15, wherein:

the ON/OFF operation of each of said switching elements is controlled by said control circuit.

17. The semiconductor device, as claimed in claim 16, wherein:

each of said switching elements is an insulating gate type field effect transistor comprising a plurality of transistor cells connected in parallel.

18. The semiconductor device, as claimed in claim 16, wherein:

said switching elements are connected in series to said fuse elements which are mutually different.

* * * * *